(12) United States Patent
Chavez et al.

(10) Patent No.: US 10,783,671 B1
(45) Date of Patent: Sep. 22, 2020

(54) SYSTEMS AND METHOD FOR ALIGNING AUGMENTED REALITY DISPLAY WITH REAL-TIME LOCATION SENSORS

(71) Applicant: Bell Textron Inc., Fort Worth, TX (US)

(72) Inventors: Jeremy Robert Chavez, Colleyville, TX (US); Daniel Wesley Rowe, Mansfield, TX (US); Michael Eugene Moody, Fort Worth, TX (US); Brian Edward Tucker, Fort Worth, TX (US)

(73) Assignee: BELL TEXTRON INC., Fort Worth, TX (US)

(*) Notice: Subject to any disclaimer, the term of this patent is extended or adjusted under 35 U.S.C. 154(b) by 0 days.

(21) Appl. No.: 16/351,270

(22) Filed: Mar. 12, 2019

(51) Int. Cl.
| | | |
|---|---|---|
| *B64D 43/02* | (2006.01) | |
| *B64D 45/00* | (2006.01) | |
| *B64F 5/60* | (2017.01) | |
| *G06T 19/00* | (2011.01) | |
| *G06T 11/00* | (2006.01) | |
| *G01S 1/04* | (2006.01) | |
| *G06F 30/20* | (2020.01) | |

(52) U.S. Cl.
CPC ............ *G06T 11/00* (2013.01); *B64D 43/02* (2013.01); *B64D 45/00* (2013.01); *B64F 5/60* (2017.01); *G01S 1/047* (2013.01); *G06F 30/20* (2020.01); *G06T 19/006* (2013.01); *B64D 2045/0085* (2013.01)

(58) Field of Classification Search
CPC ........ G06T 19/006; G05B 2219/32014; B64D 2045/0085; B64D 43/02; B64D 45/00; B64F 5/60
See application file for complete search history.

(56) References Cited

U.S. PATENT DOCUMENTS

| | | | |
|---|---|---|---|
| 9,796,479 B2 | 10/2017 | Tucker et al. | |
| 10,109,117 B2* | 10/2018 | Fournier | B64D 45/00 |
| 10,228,691 B1* | 3/2019 | Pounds | G01S 7/20 |
| 2016/0236794 A1* | 8/2016 | Tucker | B64D 45/00 |
| 2017/0032576 A1* | 2/2017 | Mazoyer | G08G 5/0021 |
| 2018/0157455 A1* | 6/2018 | Troy | G06F 3/147 |
| 2019/0171337 A1* | 6/2019 | Perrin | G08G 5/0039 |

* cited by examiner

*Primary Examiner* — Jin Cheng Wang
(74) *Attorney, Agent, or Firm* — Slater Matsil, LLP

(57) ABSTRACT

A method for aligning displayed data in an augmented reality (AR) display includes determining a selected location context associated with a piece of equipment, determining a process element associated with the piece of equipment and according to a selected engineering process, determining, according to a digital representation of the equipment, a first location of the process element, receiving meta-sensor location data for one or more meta-sensors in the piece of equipment and indicating a second location for each of the meta-sensors with respect to the selected location context, determining a third location of the AR display with respect to the selected location context, determining overlay data for the process element, determining a display location according to the first location, the third location and the location data of each meta-sensor, and displaying the overlay data at the display location.

20 Claims, 21 Drawing Sheets

SYSTEMS AND METHOD FOR ALIGNING AUGMENTED REALITY DISPLAY WITH REAL-TIME LOCATION SENSORS

TECHNICAL FIELD

The present invention relates generally to rotorcraft, and, in particular embodiments, to a system and method for manufacturing and maintenance using augmented reality devices.

BACKGROUND

Manufacturing and maintaining complex machinery, such as fixed wing aircraft or rotorcraft, are complicated and error-prone tasks. For example, rotorcraft designs may include many systems, and rotorcraft are frequently custom-made to order. Additionally, the lifespan of rotorcraft tends to require upgrades, modification, and the like, resulting in different rotorcraft having different systems, based on the level of modification or changes made to the craft. Thus, there may be some variation between different rotorcraft of a same product line, depending on the features requested by customers and the availability of parts. Further, maintaining a rotorcraft may call for different maintenance procedures, depending on the configuration of the rotorcraft, both as it was manufactured and as it has been maintained. Streamlining the manufacture and maintenance of rotorcraft may allow total ownership costs to be reduced.

SUMMARY

An embodiment method for aligning displayed data in an augmented reality (AR) display, includes determining a selected location context associated with a piece of equipment, determining a process element associated with the piece of equipment and according to a selected engineering process, determining, according to a digital representation of the piece of equipment, a first location of the process element in the piece of equipment, receiving meta-sensor location data for one or more meta-sensors disposed on the piece of equipment, the meta-sensor location data indicating a second location for each of the one or more meta-sensors with respect to the selected location context, determining a third location of the AR display with respect to the selected location context, determining overlay data associated with the process element, determining a display location according to the first location of the process element and further according the third location and the location data of each meta-sensor of the one or more meta-sensors, and displaying, by the AR display, to a user, the overlay data at the display location.

An embodiment augmented reality (AR) display device, includes a display, a processor, and a non-transitory computer-readable storage medium storing a program to be executed by the processor to align displayed data in an augmented reality (AR) display. The program includes instructions for determining a selected location context associated with a piece of equipment, determining a process element associated with the piece of equipment and according to a selected engineering process, determining, according to a digital representation of the piece of equipment, a first location of the process element in the piece of equipment, receiving meta-sensor location data for one or more meta-sensors disposed on the piece of equipment, the meta-sensor location data indicating a second location for each of the one or more meta-sensors with respect to the selected location context, determining a third location of the AR display device with respect to the selected location context, determining overlay data associated with the process element, determining a display location according to the first location of the process element and further according the third location and the meta-sensor location data, and causing the display to show the overlay data at the display location.

An embodiment system includes a real time location system (RTLS) associated with a vehicle and providing a location context, one or more meta-sensors disposed in the vehicle, each meta-sensor of the one or more meta-sensors configured to determine a respective first location representing a location of the respective meta sensor in the location context, and an augmented reality (AR) display configured to display digital overlay data in relation to at least a portion of the vehicle, further according to a second location of the AR display in relation to the location context and further according to the first location of each of the one or more meta-sensors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
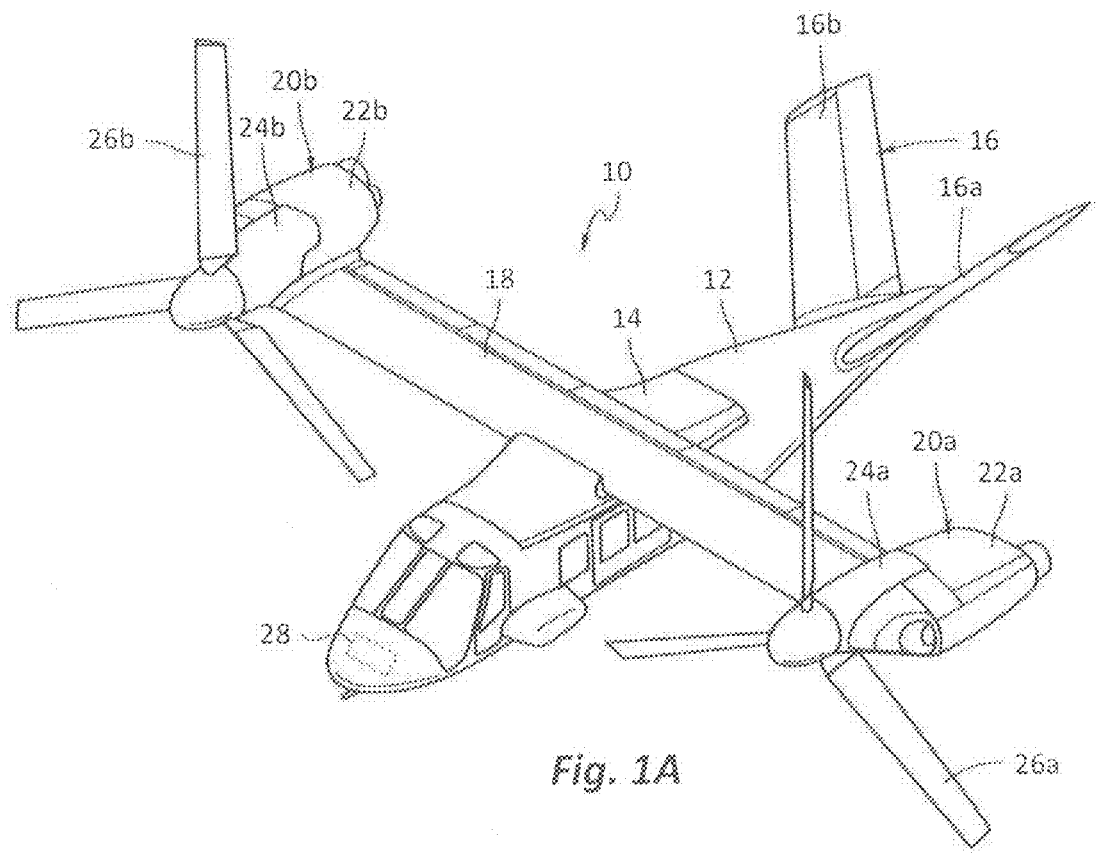
FIGS. 1A and 1B illustrate a rotorcraft, in accordance with some embodiments.

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Recently, new tools and techniques have been developed to streamline the manufacture, inspection, and maintenance of complex machinery such as rotorcraft. An assistive engineering system for manufacturing, inspecting or maintaining an apparatus such as a piece of machinery, structure, vehicle, rotorcraft, or the like, may include an augmented reality (AR) display, such as a virtual reality handset, tablet display, projected display or the like. The AR display has the ability to project digital data over or near a portion of an actual piece of machinery to instruct a technician that is manufacturing or maintaining the machinery how to perform a specific task. The AR display may include, or be connected to, a system that has a digital representation of the target machinery, and may allow the AR display to provide maintenance, assembly, inspection, or other operational instruction or data to the technician.

In order for the AR display to accurately display digital data in relation to physical features on machinery, the AR display must have an accurate representation of the AR display location in relation to the machinery at issue. The AR display provides a digital overlay that matches the relevant machinery, but requires reference points to locate, rotate and scale the digital overlay to properly align the overlay with the relevant machinery. Meta-sensors may be used as part of a real time location system (RTLS) for a region, or around a piece of machinery such as a vehicle or the like, and may report a context for each sensor, with the context provided by the RTLS providing location detection, orientation, or ranging for the meta-sensor. A meta-sensor is a sensor on a sensor assembly having one or more operating sensors that may be used for detecting operating parameters such as acceleration, speed, location, vibration, or the like for a vehicle, machine, device, system, or the like. The meta-sensor determines physical characteristics of the sensor assembly such as orientation, location within the machinery, or the like. The meta-sensor determines and transmits sensor data for use by the AR display.

The AR display may determine the location, orientation, scale, and the like, of target machinery, parts, devices, or the like, using sensor data, or location data or the like, from the meta-sensor, from a wireless beacon, or from a combination meta-sensor data and beacon location data. In some embodiments, the AR display may determine a location according to a transmission from a beacon in the RTLS system. The AR display may use the context or location of the meta-sensor may be used alone, or in combination with, location data determined from the beacon, and may determine the orientation of relevant machinery with respect to the beacon or meta-sensor location according to data, such as a digital representation of the machinery defining the layout of the machinery.

Thus, the AR display may use the location and/or orientation of the AR display itself, in combination with the sensor data, to determine which portions of a selected digital data representation of the relevant machinery should be displayed by determining whether the relevant digital data should be included in the AR display field of view. Additionally, the AR display may use the sensor data to determine the orientation of the relevant machinery when the AR displays the relevant digital data, or use the location and orientation of the relevant machinery to determine, for example, scaling of the display digital data based on the distance of the AR display from the desired display area for the digital data.

Apparatus data generated by the meta-sensor may include sensor data and may also include sensor metadata such as location, rotation, or other physical characteristics of the meta-sensor within the RTLS, the type of sensor, sensor identifiers, sensor capabilities, or the like. The AR display receives the sensor metadata, and from the locations of the meta-sensors indicated by the metadata, identifies the sensors and the relation of the AR display to the sensors to accurately display the digital overlay with a high degree of precision. Thus, the assistive engineering system can accurately align the digital data displayed on the AR system using location data from the meta-sensors or beacons with minimal user intervention.

Figure 1B:
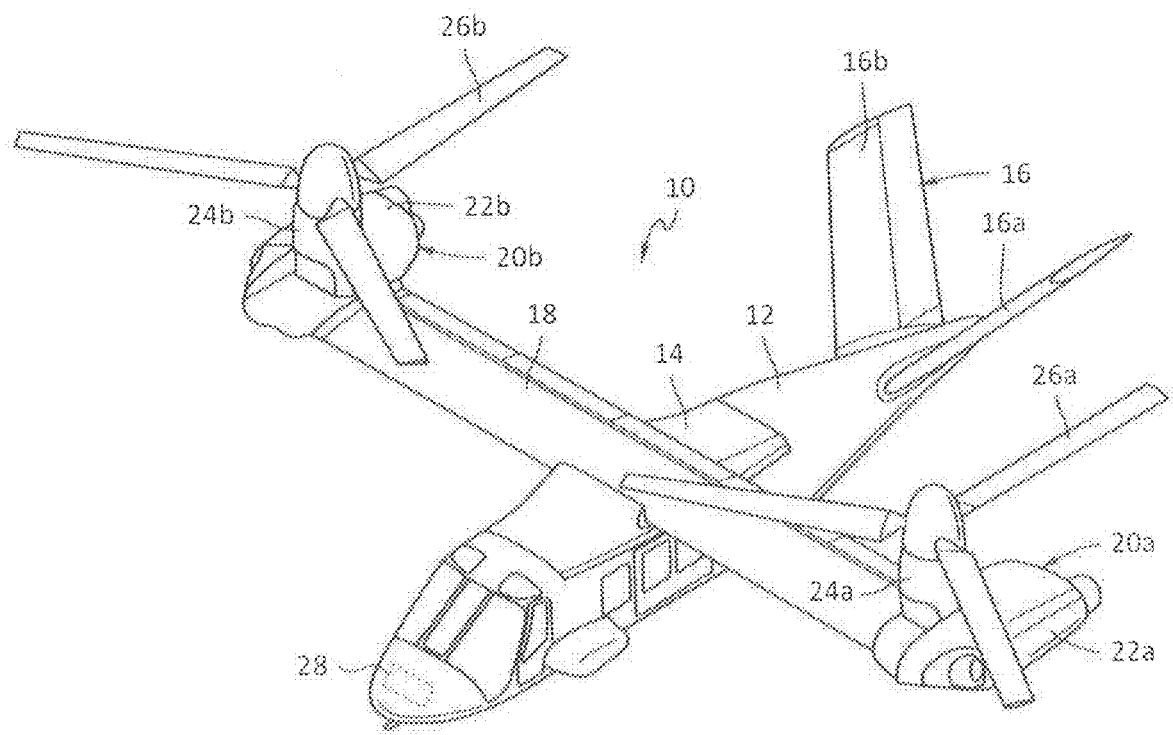

FIGS. 1A and 1B illustrate a rotorcraft 10, in accordance with some embodiments, and are described together. The rotorcraft 10 is a tiltrotor aircraft that may operate in a forward flight mode (shown in FIG. 1A), a vertical takeoff and landing (VTOL) flight mode (shown in FIG. 1B), or a conversion flight mode between VTOL and forward flight modes (not shown). The rotorcraft 10 includes a fuselage 12, a wing mount assembly 14 that is rotatable relative to fuselage 12, and a tail assembly 16 mounted at an aft end of the fuselage 12. The fuselage 12 accommodates a crew, passengers, cargo, and/or the like. Further, the fuselage 12 houses some components of the rotorcraft 10, such as displays, controls, instruments, computers, and the like. The wing mount assembly 14 supports a wing 18, which generates lift in forward flight. The tail assembly 16 includes rotatably mounted tail members 16a and 16b, having control surfaces operable for horizontal and/or vertical stabilization during forward flight. Together, the fuselage 12, wing mount assembly 14 tail assembly 16, and wing 18 (as well as their various frames, longerons, stringers, bulkheads, spars, ribs, skins and the like) form the airframe of the rotorcraft 10.

Propulsion assemblies 20a and 20b are fixed at the outboard ends of the wing 18. The propulsion assemblies 20a and 20b, respectively, include fixed nacelles 22a and 22b, pylon assemblies 24a and 24b, and proprotor assemblies 26a and 26b. The fixed nacelles 22a and 22b house an engine and a fixed portion of the drive system for the rotorcraft 10, and are positioned above the wing 18. The pylon assemblies 24a and 24b house a rotatable portion of the drive system for the rotorcraft 10, and are rotatable relative to the wing 18 and the fixed nacelles 22a and 22b. In particular, the pylon assemblies 24a and 24b may be rotated to a substantially vertical orientation (for forward flight, shown in FIG. 1A), a substantially horizontal orientation (for VTOL, shown in FIG. 1B), or an orientation therebetween (for conversion flight mode). The proprotor assemblies 26a and 26b are affixed to the pylon assemblies 24a and 24b, and are rotatable responsive to torque and rotational energy provided by the engine and drive system. During all flight modes, the proprotor assemblies 26a and 26b rotate in opposite directions to provide torque balancing to the rotorcraft 10.

In forward flight mode (shown in FIG. 1A), the proprotor assemblies 26a and 26b rotate in a substantially vertical plane to provide a forward thrust enabling the wing 18 to provide a lifting force responsive to forward airspeed, allowing the rotorcraft 10 to fly in a manner similar to a propeller-driven airplane. In VTOL flight mode (shown in FIG. 1B), the proprotor assemblies 26a and 26b rotate in a substantially horizontal plane to provide a lifting thrust, allowing the rotorcraft 10 to fly in a manner similar to a helicopter. It should be appreciated that rotorcraft 10 may also be operated in a conversion mode, where the proprotor assemblies 26a and 26b are selectively positioned between the horizontal and vertical planes. Further, although the rotorcraft 10 has been described as having one engine in each of the fixed nacelles 22a and 22b, it should be appreciated that other propulsion system arrangements are possible. For example, the rotorcraft 10 may include a single engine providing torque and rotational energy to both of the proprotor assemblies 26a and 26b. The single engine may be housed in the fuselage 12, one of the fixed nacelles 22a or 22b, or the like.

The rotorcraft 10 further includes rotorcraft computers 28. In the embodiment shown, the rotorcraft computers 28 are housed in the fuselage 12, although it should be appreciated that the rotorcraft computers 28 may be located anywhere. Further, the rotorcraft computers 28 may be located in a centralized location or distributed throughout the rotorcraft 10. One or more systems (discussed further below) within the rotorcraft 10 may be partially or wholly embodied on the rotorcraft computers 28 as software and/or hardware for performing any functionality described herein.

Figure 2:
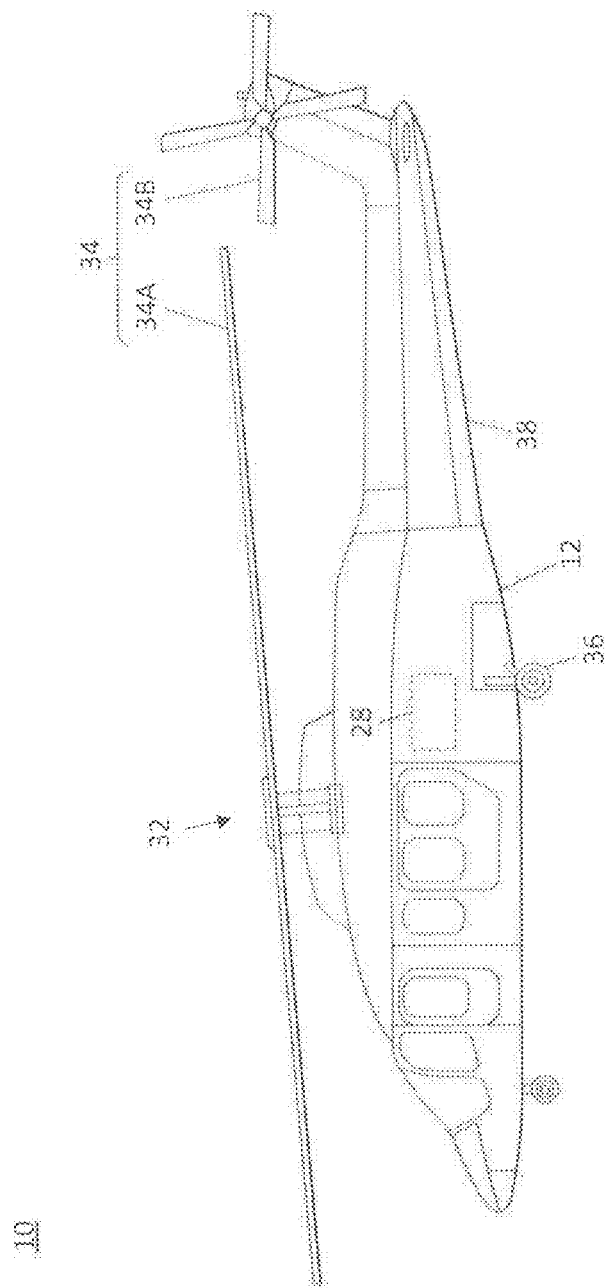
FIG. 2 illustrates a rotorcraft, in accordance with some other embodiments.

FIG. 2 illustrates the rotorcraft 10, in accordance with some other embodiments. In this embodiment, the rotorcraft 10 is a helicopter, and includes a power train system 32, rotor blades 34, landing gear 36, and an empennage 38. The rotor blades 34 include main rotor blades 34A and tail rotor blades 34B. The power train system 32 rotates the main rotor blades 34A and optionally the tail rotor blades 34B. The power train system 32 includes one or more engines, a gearbox, a rotor mast, and a tail rotor drive shaft. The engines supply torque to the rotor mast via the gearbox, thus rotating the main rotor blades 34A. The engines may also supply torque to the tail rotor drive shaft, thus rotating the tail rotor blades 34B. The power train system 32 may include a swashplate for collectively or cyclically controlling the pitch of each of the main rotor blades 34A in order to selectively control direction, thrust, and lift of the rotorcraft 10. The fuselage 12 is coupled to the power train system 32 such that the power train system 32 and rotor blades 34 move the fuselage 12 through the air during operation. The landing gear 36 supports the rotorcraft 10 when the rotorcraft 10 is grounded. The empennage 38 represents the tail section of the aircraft and connects the fuselage 12 to the tail rotor blades 34B. The power train system 32 and tail rotor blades 34B may collectively provide thrust in the same direction as the rotation of the main rotor blades 34A, so as to counter torque effects created by the main rotor blades 34A.

Although the rotorcraft 10 of FIG. 2 is illustrated in subsequent descriptions, it should be appreciated that embodiments may be applied to any type of rotorcraft, including the rotorcraft 10 of FIGS. 1A and 1B. Some embodiments may also apply to other types of aircraft, such as fixed-wing aircraft.

Figure 3A:
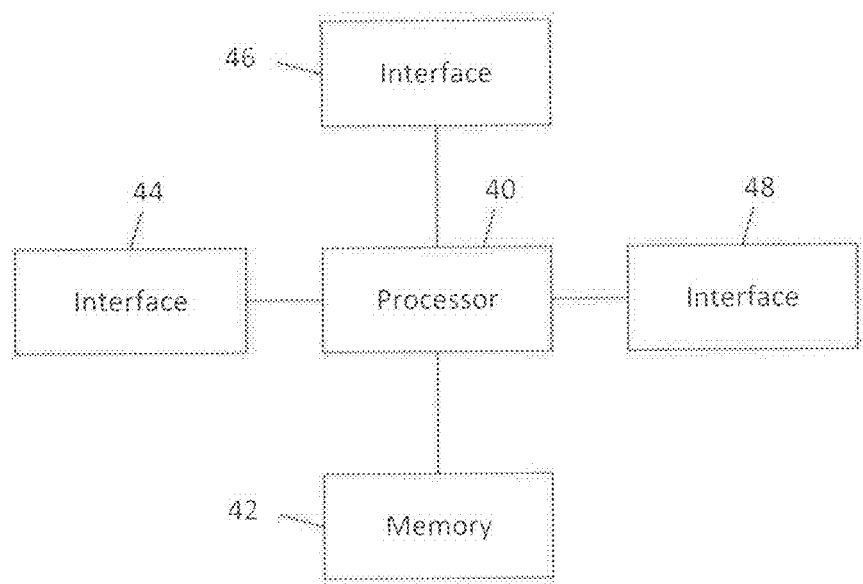
FIG. 3A is a block diagram of a rotorcraft computer, in accordance with some embodiments.

FIG. 3A is a block diagram of a rotorcraft computer 28, in accordance with some embodiments. As shown, the rotorcraft computers 28 include a processor 40, a memory 42, and interfaces 44-48, which may (or may not) be arranged as shown. The processor 40 may be any component or collection of components adapted to perform computations and/or other processing related tasks, and the memory 42 may be any component or collection of components adapted to store programming and/or instructions for execution by the processor 40. In an embodiment, the memory 42 includes a non-transitory computer readable medium. The interfaces 44, 46, 48 may be any component or collection of components that allow the rotorcraft computers 28 to communicate with other devices/components and/or a user. For example, one or more of the interfaces 44, 46, 48 may be adapted to communicate data, control, or management messages from the processor 40 to applications installed on the host device and/or a remote device. As another example, one or more of the interfaces 44, 46, 48 may be adapted to allow a user or user device (e.g., personal computer (PC), etc.) to interact/communicate with the rotorcraft computers 28. The rotorcraft computers 28 may include additional components not depicted, such as long term storage (e.g., non-volatile memory, etc.).

Figure 3B:
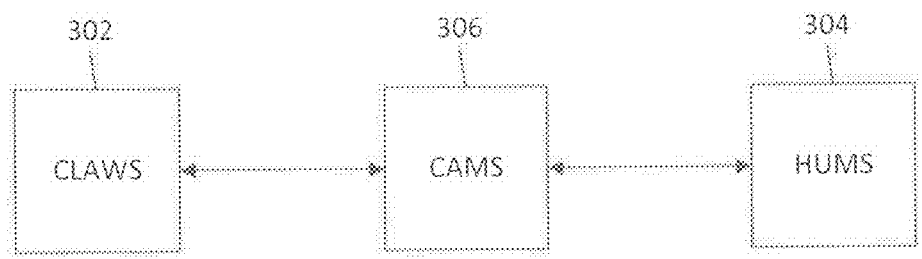
FIG. 3B is a block diagram of systems of a rotorcraft, in accordance with some embodiments.

FIG. 3B is a block diagram of systems of the rotorcraft 10, in accordance with some embodiments. The systems include a flight control system 302, a health and usage monitoring system (HUMS) 304, and a configuration and maintenance system (CAMS) 306. The rotorcraft 10 may include other systems, or may omit some of the illustrated systems. Elements of the illustrated systems are implemented at least partially by the rotorcraft computers 28. In some embodiments, the rotorcraft computers 28 include multiple computers that each perform dedicated tasks for one of the systems.

The flight control system 302 is operable to control flight of the rotorcraft 10, and may be embodied on flight control computers (FCCs). In some embodiments, the rotorcraft 10 is a fly-by-wire rotorcraft. In such embodiments, the flight control system 302 is operable to execute one or more control laws (CLAWS) that control flight of the rotorcraft 10. In some embodiments, the flight control system 302 is implemented as a series of inter-related feedback loops running certain control laws. The loops may include inner stabilization and rate augmentation loops, and outer guidance and tracking loops that are separated from the inner loops. The control laws running in the loops allow for decoupling of otherwise coupled flight characteristics, which in turn may provide for more stable flight characteristics and reduced pilot workload. The control loops control flight of the rotorcraft 10 according to signals received from sensors. The sensors may include pilot flight control sensors, airspeed sensors, altitude sensors, attitude sensors, position sensors, orientation sensors, temperature sensors, airspeed sensors, or the like. Filters may be applied by the control loops to the signals received or obtained from the sensors. The filters are defined by parameters such as the filter gains, center frequencies, widths, the like, and help stabilize flight control of the rotorcraft 10.

The HUMS 304 is operable to monitor the health and operating conditions of the rotorcraft 10. The HUMS 304 performs data collection and analysis with signals received from sensors, e.g., during flight. The sensors are located on critical (or non-critical) components of the rotorcraft 10, such as on the engine and drive system. The sensors gather data relating to parameters of the monitored components and provide the data to the HUMS 304. The data obtained by the sensors is typically in an analog format, and may be converted into a digital format or signal. The HUMS 304 may analyze the signals, or may store the signals and later transfer them to a ground station for operator analysis. For example, if the rotorcraft 10 experiences a high drive shaft torque loading over a certain period of time, the HUMS 304 acquires the relevant data from the sensors for analysis such that timely inspection and/or maintenance of bearings or other rotorcraft systems can be performed. The HUMS 304 may also perform self-testing of the rotorcraft 10, where the HUMS 304 tests different systems of the rotorcraft 10 and analyzes sensor feedback to determine whether those systems have any potential issues that should be investigated. Self-testing may be performed automatically by the HUMS 304 and the results may be stored for later retrieval, e.g., by a maintenance crew.

Figure 3C:
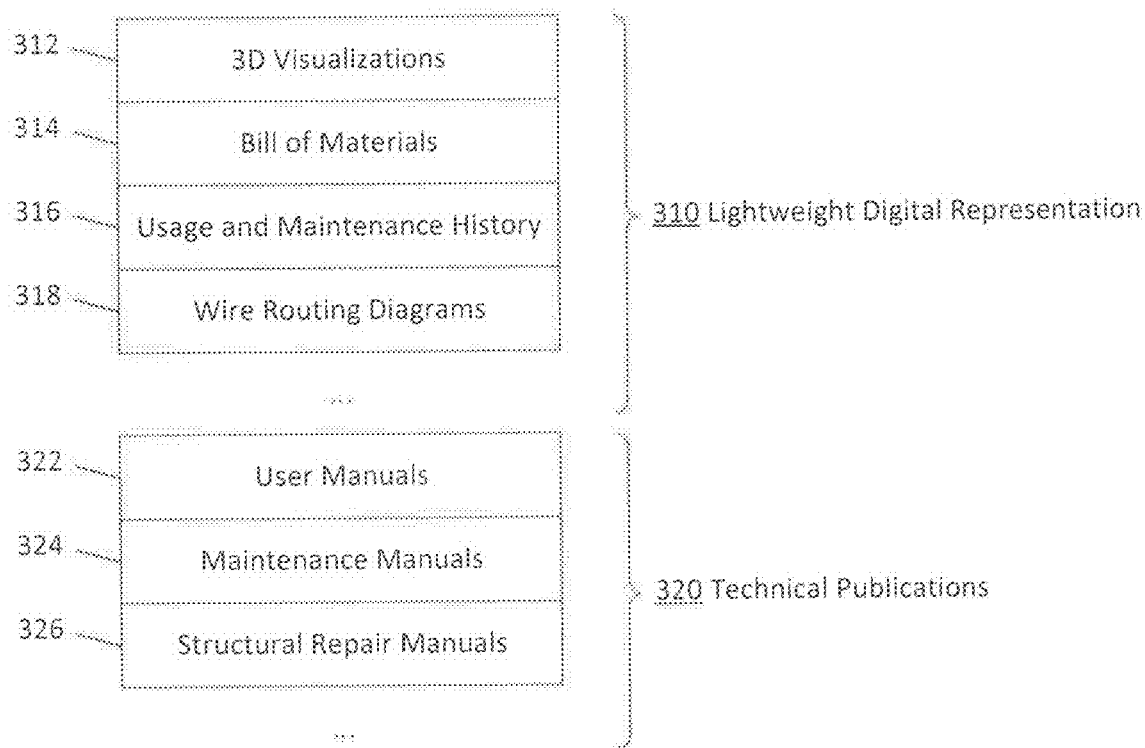
FIG. 3C illustrates a data structure for individualized equipment data, in accordance with some embodiments.

The CAMS 306 is operable to store individualized equipment data for the rotorcraft 10. FIG. 3C illustrates a data structure for the individualized equipment data, in accordance with some embodiments. The individualized equipment data includes a lightweight digital representation 310 of the rotorcraft 10 and technical publications 320 for the rotorcraft 10.

The lightweight digital representation 310 of the rotorcraft 10 is a collection of configuration and usage data for the rotorcraft 10. The lightweight digital representation 310 may include a three-dimensional (3D) visualizations 312 for the rotorcraft 10, a bill of materials (BOM) 314 for the rotorcraft 10, usage and maintenance history 316 of the rotorcraft 10, wire routing diagrams 318 for the rotorcraft 10, and the like. The 3D visualizations 312 include meshes, materials, shaders, textures, and the like for rendering a 3D view of the rotorcraft 10 or its components. The BOM 314 is a list of components and the quantities of each in the rotorcraft 10. Examples of components include raw materials, sub-assemblies, intermediate assemblies, sub-components, pails, and the like. The 3D visualizations 312 include visualizations or models for each component listed on the BOM 314. The usage and maintenance history 316 includes maintenance logs and usage logs for the rotorcraft 10. The maintenance logs track each maintenance task performed on the rotorcraft 10. The usage logs track samples from sensors of the rotorcraft 10 during usage. The maintenance logs and usage logs may include data for the entire lifetime of the rotorcraft 10, e.g., going back to the manufacture date of the rotorcraft 10, and may, in some embodiments, include history, usage or maintenance records for individual components, systems, or the like. The lightweight digital representation 310 is customized and specific to the tail number of the rotorcraft 10, and may be generated based on manufacturing data, maintenance data, and usage data of the rotorcraft 10.

The technical publications 320 are manuals for the rotorcraft 10. The technical publications 320 include user manuals 322, maintenance manuals 324, structural repair manuals 326, and the like. In some embodiments, the technical publications 320 are flat documents that may be viewed on a display or as printed documents. The flat documents may include two-dimensional (2D) views of the rotorcraft 10. In some embodiments, the technical publications 320 are interactive documents that may be viewed on a tablet, headset, or the like. The interactive documents may include 3D views of the rotorcraft 10 that are rendered on a viewing device. The views (2D or 3D) for the technical publications 320 may be rendered using the lightweight digital representation 310. The technical publications 320 are customized and specific to the tail number of the rotorcraft 10, and may be generated based on the lightweight digital representation 310 of the rotorcraft 10.

The illustrated systems of the rotorcraft 10 may communicate with one another. In some embodiments, the CAMS 306 communicates with and controls the flight control system 302. For example, the CAMS 306 may reconfigure the flight control system 302 according to the lightweight digital representation of the rotorcraft 10. In some embodiments, the CAMS 306 communicates with and receives data from the HUMS 304. Sensor signals and self-test results may be obtained from the HUMS 304, and may be analyzed to determine health and usage data for the rotorcraft 10, and the CAMS 306 may reconfigure the flight control system to adjust control or flight parameters based on the HUMS health status. For example, if the HUMS 304 reports that a portion of a tail surface or flight control device is not operating properly, the CAMS 306 may compensate for the decreased tail control authority by offloading a portion of the tail control to, for example, the rotor so that commands that would normally be handled by the tail surface are implemented using the rotor.

Figure 4:
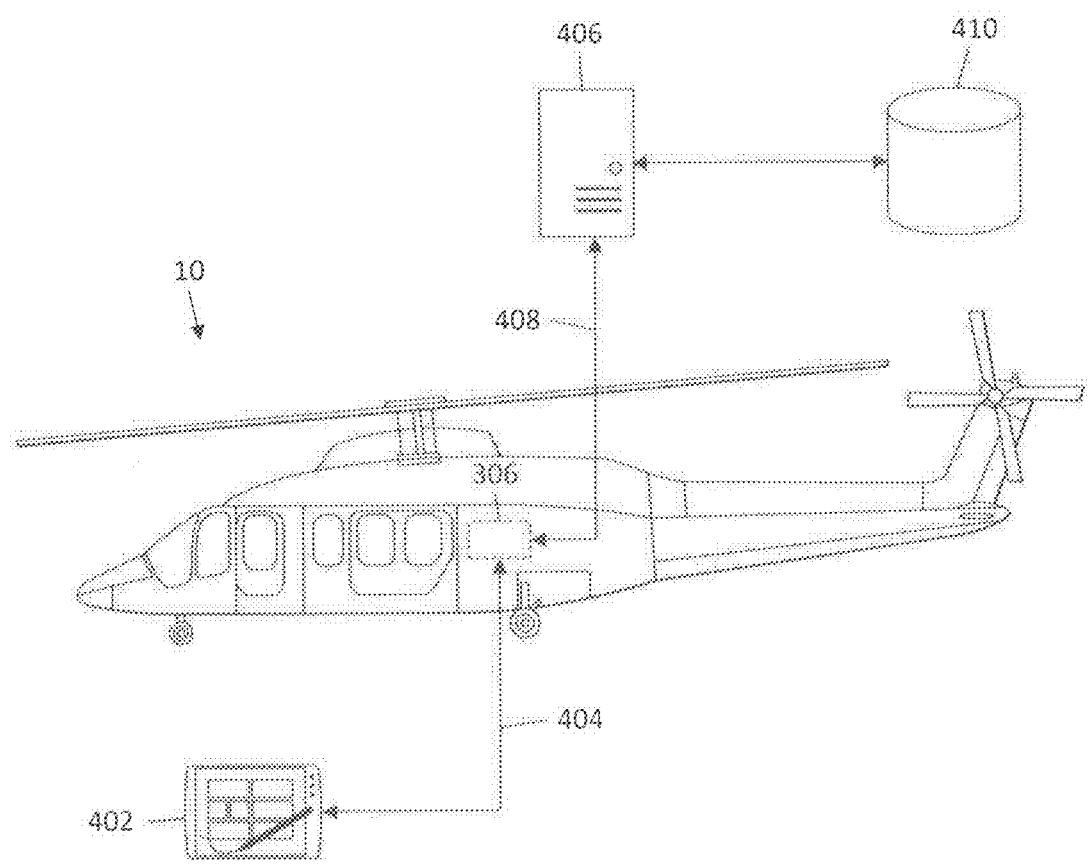
FIG. 4 illustrates a rotorcraft maintenance system, in accordance with some embodiments.

FIG. 4 illustrates a rotorcraft maintenance system 400, in accordance with some embodiments. In the rotorcraft maintenance system 400, a user (such as a maintenance crew member) interacts with the CAMS 306 using a remote terminal 402. Further, the CAMS 306 communicates with one or more fleet management servers 406.

The remote terminal 402 may be a tablet, headset, personal computer, or the like, and may communicate with the CAMS 306 over a connection 404. The connection 404 may be a wired or wireless connection, such as an Ethernet connection, a Wi-Fi connection, a Bluetooth connection, a light based communication such as Li-Fi, magnetic wave communication, or the like. In some embodiments, the remote terminal 402 is paired with one rotorcraft 10, and interacts with the CAMS 306 corresponding to the paired rotorcraft 10. The remote terminal 402 may be used to perform several operations with the CAMS 306. Examples of such operations include viewing the technical publications for the rotorcraft 10, viewing the lightweight digital representation of the rotorcraft 10, entering maintenance records for the rotorcraft 10, and the like.

When viewing technical publications or the lightweight digital representation of the rotorcraft 10, the individualized equipment data is streamed from the CAMS 306 to the remote terminal 402. Viewing the technical publications may include displaying text from the publications, and rendering views to accompany the text using the 3D visualizations from the lightweight digital representation of the rotorcraft 10. Viewing the lightweight digital representation may include viewing the BOM and 3D visualizations for the rotorcraft 10. The remote terminal 402 is a thin client that may be used to view the individualized equipment data for the rotorcraft 10, without persisting the individualized equipment data in the long-term. By storing the individualized equipment data on the CAMS 306, and not on the remote terminal 402, the individualized equipment data may more easily follow the rotorcraft 10, and may be accessed regardless of whether a given remote terminal 402 is available.

Maintenance records for the rotorcraft 10 may be entered using the remote terminal 402. A maintenance crew may enter records when performing maintenance on the rotorcraft 10. For example, when a given part of the rotorcraft 10 is replaced, the remote terminal 402 may be used to record the replacement in the CAMS 306. The new maintenance records may be temporarily stored on the CAMS 306 for transfer to the fleet management servers 406. Maintaining maintenance records for the rotorcraft 10 may be required by law, and entering such records in the CAMS 306 as the maintenance crew works may help ensure regulatory compliance. Additionally, an RTLS may detect that parts have been removed, adjusted or replaced by detecting that a meta-sensor has left the context of the RTLS system, or is reporting new or different location data, orientation data, or the like. The RTLS may then notify the CAMS system so that the maintenance records are updated.

The CAMS 306 also communicates with fleet management servers 406 during operation. The fleet management servers 406 may update the individualized equipment data for the rotorcraft 10 based on usage and maintenance data from the CAMS 306, and may send the updated individualized equipment data back to the rotorcraft 10 for storage on the CAMS 306. The usage and maintenance data may include health and usage data collected by the HUMS 304 and maintenance records entered with the remote terminal 402. The CAMS 306 communicates with the fleet management servers 406 over a connection 408. The connection 408 may be a wired or wireless connection, such as an Ethernet connection, a Wi-Fi connection, a cellular connection, a satellite link, an aircraft communications addressing and reporting system (ACARS) link, or the like. The individualized equipment data may be stored in a location accessible to the fleet management servers 406, such as in a database 410. The database 410 may be a relational database, such as a structured query language (SQL) database, or may be a non-relational database, such as a key-value store.

Figure 5:
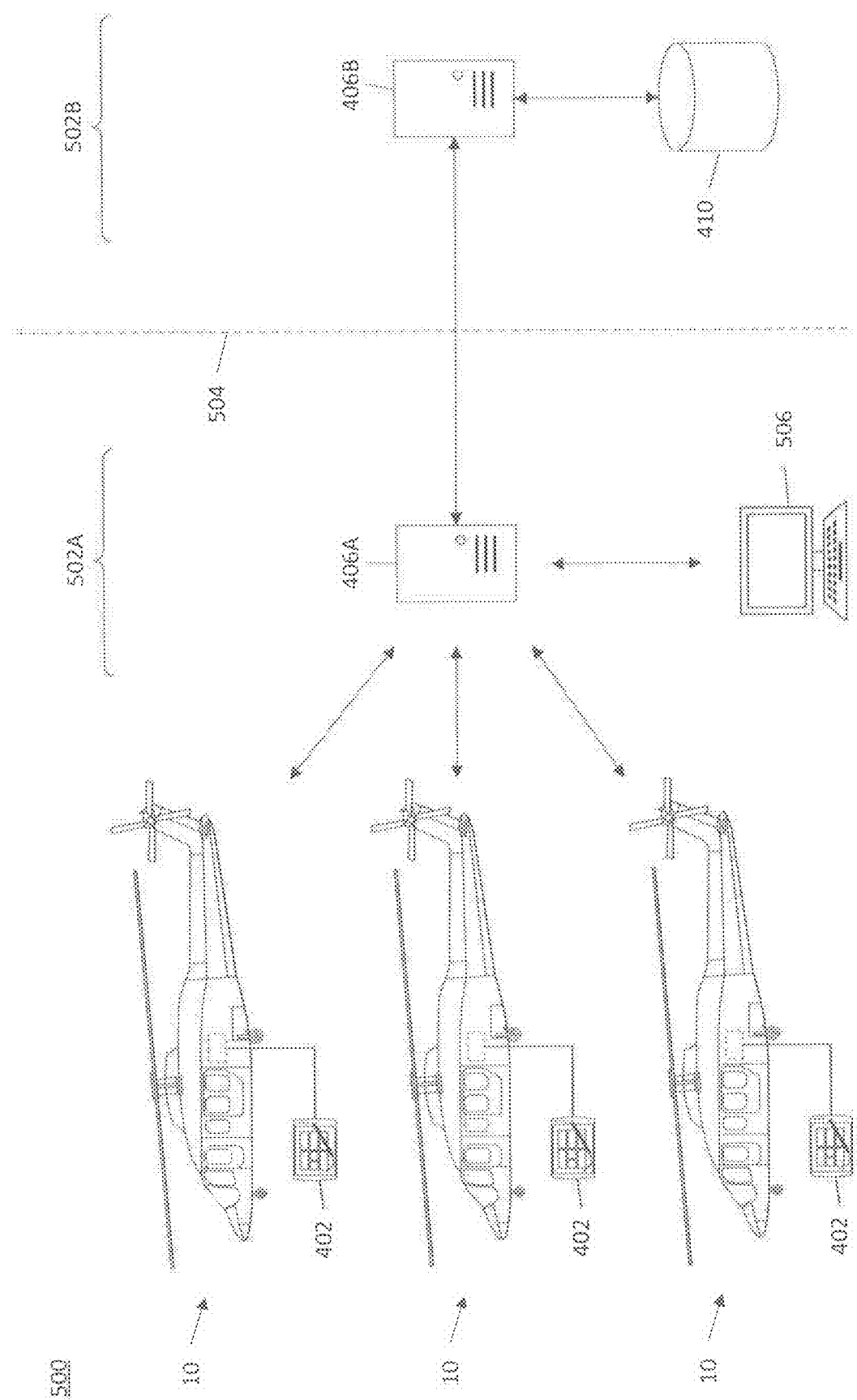
FIG. 5 illustrates a fleet management system, in accordance with some embodiments.

FIG. 5 illustrates a fleet management system 500, in accordance with some embodiments. In the fleet management system 500, the fleet management servers 406 communicate with and manage a fleet of rotorcraft 10, and maintain individualized equipment data for the rotorcraft 10 in the fleet. In particular, the fleet management servers 406 aggregate the usage and maintenance data of the rotorcraft 10 in the fleet, and update the individualized equipment data for the rotorcraft 10 based on the aggregated usage and maintenance data.

In the fleet management system 500, the fleet management servers 406 include servers located on networks 502 operated by different entities. The networks 502 include a front-end network 502A and a back-end network 502B, which may be separated by a firewall 504. In the embodiment shown, the fleet management servers 406 include front-end fleet management servers 406A on the front-end network 502A, and further include back-end fleet management servers 406B on the back-end network 502B. For example, the front-end network 502A may be operated by the owner or maintainer of the rotorcraft 10, and the back-end network 502B may be operated by the manufacturer of the rotorcraft 10. The database 410 may be located on the back-end network 502B with the back-end fleet management servers 406B. The front-end fleet management servers 406A perform a subset of functions, and the back-end fleet management servers 406B perform a different subset of functions. In particular, the front-end fleet management servers 406A may perform the aggregation of fleet data, and the back-end fleet management servers 406B may perform the updating of individualized equipment data for the fleet.

In other embodiments, the fleet management servers 406 are located on a network operated by a single entity. For example, the network may be operated by the owner or maintainer of the rotorcraft 10, or by the manufacturer of the rotorcraft 10. The same set of fleet management servers 406 may perform both the aggregation of fleet data and the updating of individualized equipment data for the fleet.

In some embodiments, the fleet management system 500 further includes an operator terminal 506, which may communicate with the fleet management servers 406. The operator terminal 506 is a user interface for the fleet management system 500, and may be accessed by a user (such as a maintenance crew member). The operator terminal 506 may be used to view fleet status. Further, the fleet management servers 406 may provide notifications to the operator terminal 506. The notifications may include information or warnings about the rotorcraft 10 in the fleet.

Figure 6:
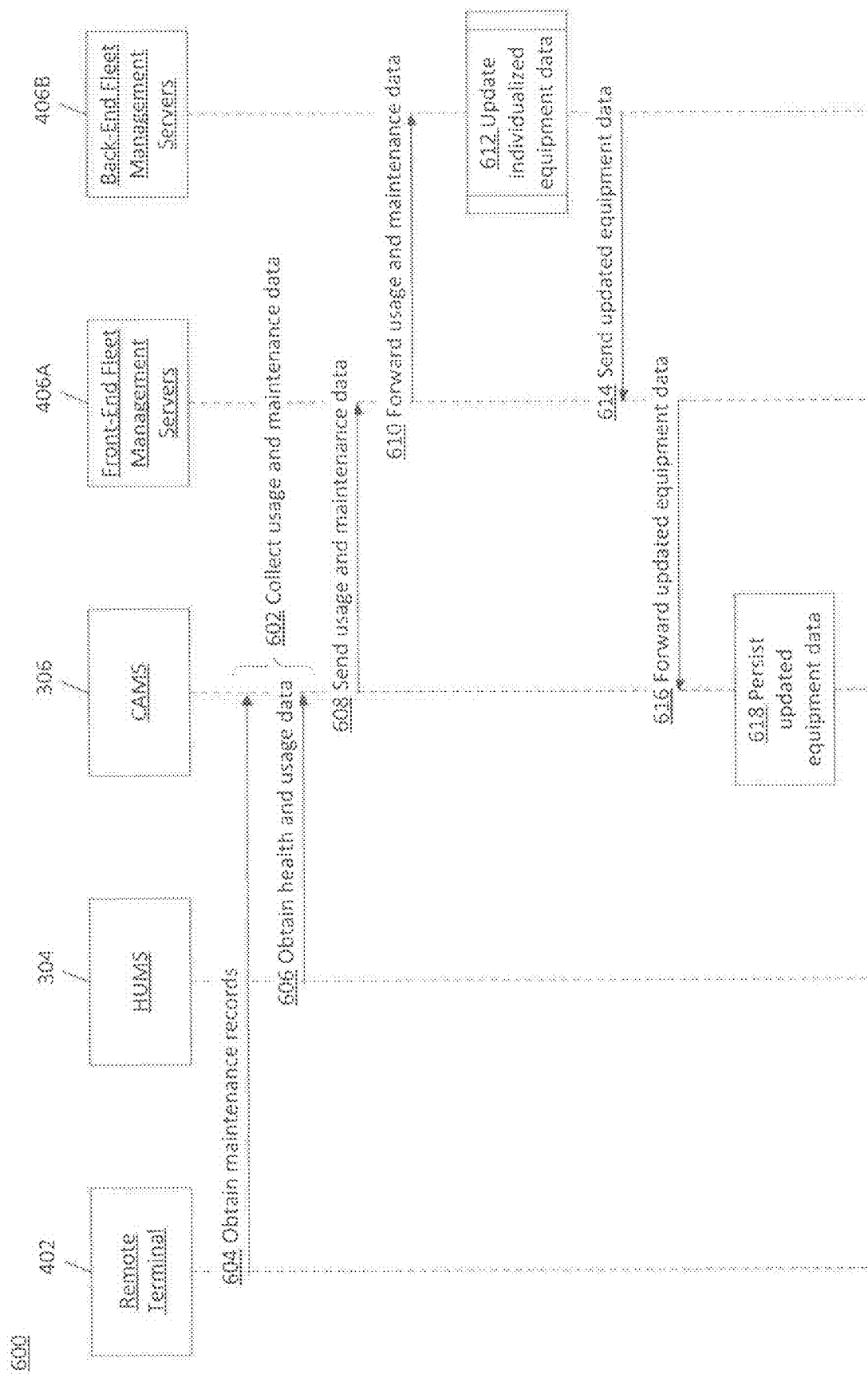
FIG. 6 is a protocol diagram showing operations when updating individualized equipment data for a rotorcraft, in accordance with some embodiments.

FIG. 6 is a protocol diagram 600 showing operations when updating individualized equipment data for the rotorcraft 10, in accordance with some embodiments. Operations shown in the protocol diagram 600 may be performed periodically, or in response to a user requesting updated equipment data, e.g., with the remote terminal 402. In some embodiments, the operations are performed automatically in response to a particular event, such as in response to the connection 408 being established or restored.

The CAMS 306 collects usage and maintenance data for the rotorcraft 10 (step 602). In the embodiment shown, the CAMS 306 collects the usage and maintenance data by obtaining maintenance records entered by a maintenance crew with the remote terminal 402 (step 604) and by obtaining health and usage data from the HUMS 304 (step 606). The usage and maintenance data may not include all historic data for the rotorcraft 10, but rather may be data about usage and maintenance of the rotorcraft 10 since the last update of the individualized equipment data.

The CAMS 306 sends the collected usage and maintenance data to the fleet management servers 406. The maintenance records, usage, and self-test data may be temporarily stored on the CAMS 306 and then sent to the fleet management servers 406 when data collection is completed. In the embodiment shown, the usage and maintenance data is sent to the front-end fleet management servers 406A (step 608) and is then forwarded to the back-end fleet management servers 406B (step 610). In some embodiments, the front-end fleet management servers 406A aggregate the usage and maintenance data for some or all of the rotorcraft 10 in the fleet, and forward the aggregated data to the back-end fleet management servers 406B periodically. For example, aggregated data may be forwarded at a regular time interval. The aggregated data may be forwarded in a single request, to reduce the total quantities of round trips to the back-end fleet management servers 406B. In embodiments where the fleet management servers 406 are located on a network operated by a single entity, the forwarding step may be omitted.

The fleet management servers 406 update the individualized equipment data for the rotorcraft 10 (step 612). The fleet management servers 406 obtain the current individualized equipment data by retrieving it from the database 410 based on the tail number of the rotorcraft 10. The individualized equipment data (e.g., the technical publications and the lightweight digital representation) for the rotorcraft 10 is then updated according to the received usage and maintenance data from the CAMS 306. The updating may also be performed according to proprietary information accessible to the fleet management servers 406, such as engineering and manufacturing data for the rotorcraft 10. Updating the individualized equipment data allows it to accurately reflect the state of the rotorcraft 10 as it is maintained at any given point in time. The updated individualized equipment data is then persisted in the database 410.

In some embodiments, the back-end fleet management servers 406B host a publicly accessible service or application programming interface (API) for updating the individualized equipment data of the rotorcraft 10. For example, the API may accept the aggregated usage and maintenance data as an input parameter, and may produce the updated individualized equipment data as an output parameter. As noted above, generating the individualized equipment data for the rotorcraft 10 may be performed using proprietary information from the manufacturer. Separating the aggregation of data from the updating of individualized equipment data, and performing updating with a publicly accessible API may allow the individualized equipment data to be updated by the manufacturer without sharing the proprietary information with customers of the rotorcraft 10.

The fleet management servers 406 then send a copy of the updated individualized equipment data to the CAMS 306. In the embodiment shown, the updated individualized equipment data is sent to the front-end fleet management servers 406A (step 614) and is then forwarded to the CAMS 306 (step 616). In embodiments where the fleet management servers 406 are located on a network operated by a single entity, the forwarding step may be omitted. In some embodiments, the updated individualized equipment data is sent in its entirety to the CAMS 306. In some embodiments, differences between the old and updated individualized equipment data are determined, and the differences are sent to the CAMS 306. Some portions of the lightweight digital representation (such as the 3D visualizations) may be large in size. Sending the updated individualized equipment data to the CAMS 306 by sending differences between the old and updated data may reduce the bandwidth consumed by the fleet management servers 406. The CAMS 306 persists the received individualized equipment data (step 618). The individualized equipment data may be stored on, e.g., the memory 42 of the rotorcraft computers 28.

Figure 7:
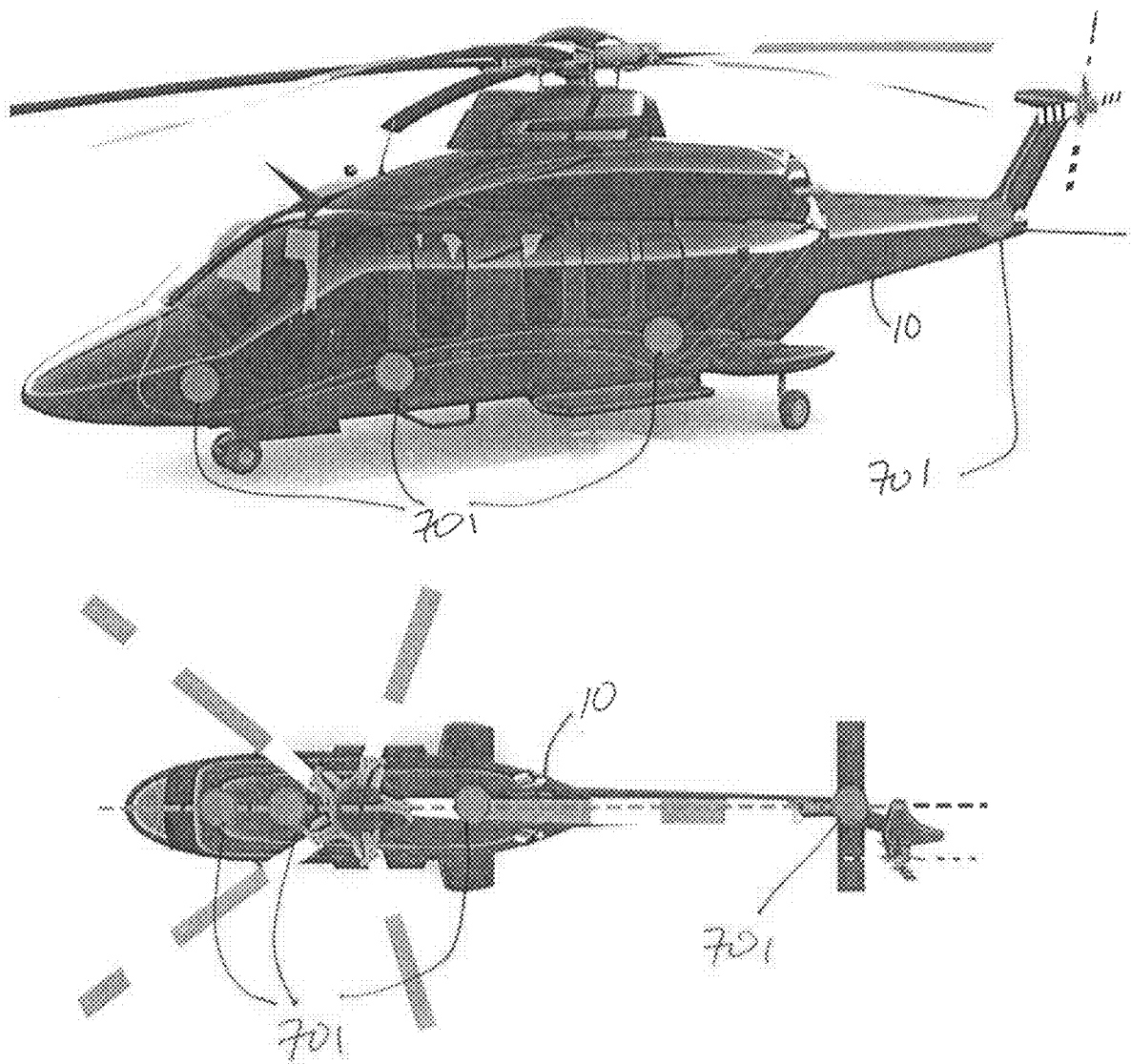
FIG. 7 is a view of a rotorcraft illustrating the layout of one or more meta-sensors according to some embodiments.
Figure 7:
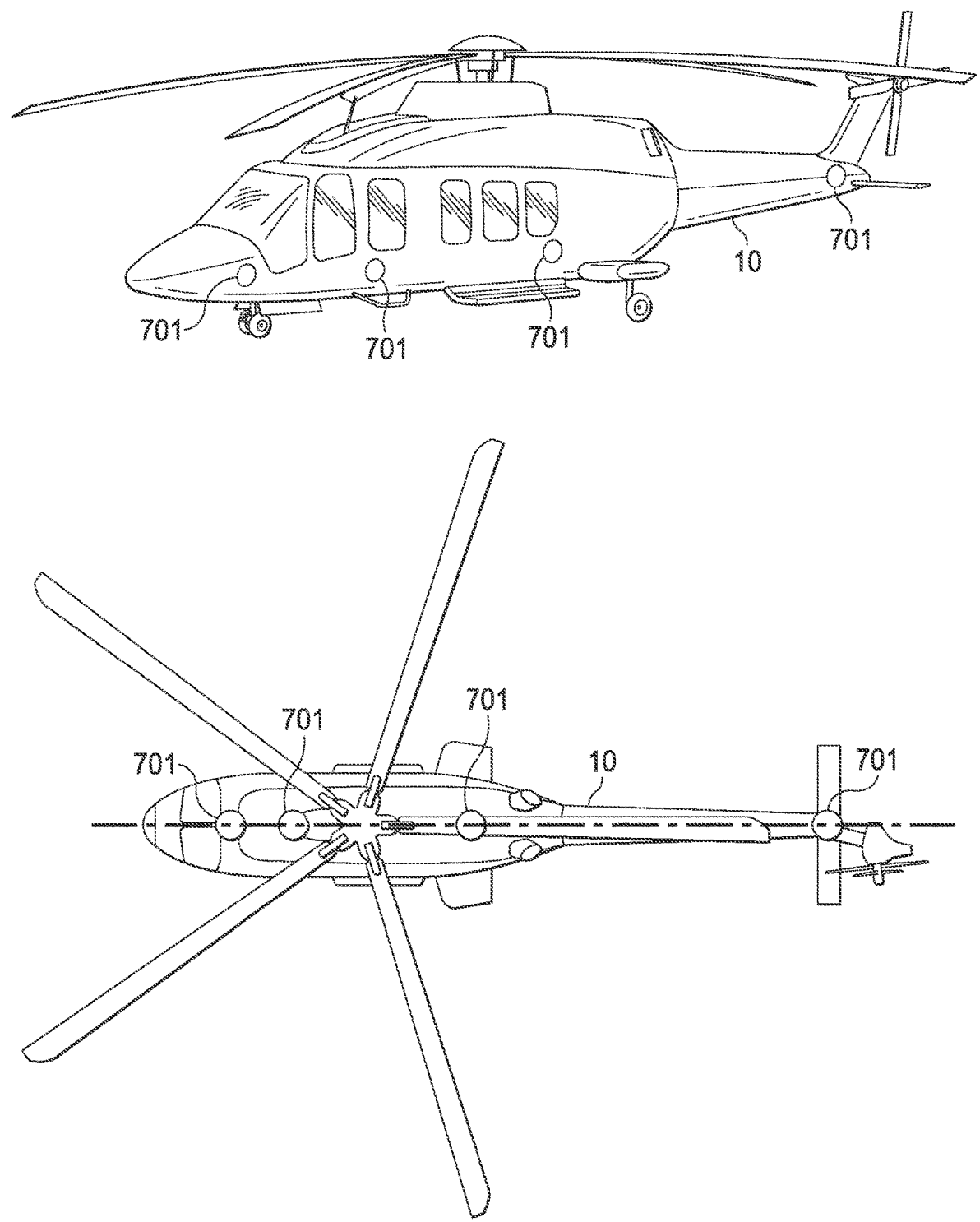

FIG. 7 is a view of a rotorcraft 10 illustrating the layout of one or more meta-sensors 701 according to some embodiments. The rotorcraft 10 is used for illustrative purposes, as any type of apparatus or equipment may have meta-sensors 701 disposed thereon. The relevant equipment, in this case, a rotorcraft 10, may have one or more meta-sensors 701 disposed in, or on, the structure of the equipment. In some embodiments, the meta-sensors 701 are part of equipment or an aircraft sensor assembly that has an aircraft sensor. The aircraft sensor may, in various embodiments, be a vibration sensor, a force sensor, an accelerometer, or another type of sensor. The meta-sensors 701 may determine their own location and orientation relative to the body of the rotorcraft 10 using an RTLS associated with the rotorcraft 10, and may transmit the location data to a data acquisition system, a beacon, an assistive engineering system, an AR display, or the like. In some embodiments, the location data may be transmitted as part of sensor metadata, which may include sensor data such as the meta-sensor location, rotation, or other physical characteristics, the type of sensor, sensor identifiers, sensor capabilities, or the like.

The meta-sensor 701 may be a sensor that is separate from the aircraft sensor, and may handle management of the sensor assembly while the aircraft sensor measures one or more predetermined physical operating characteristics of the apparatus on which the sensor assembly is disposed. For example, the meta-sensor 701 may generate location and orientation data based on a wireless signal received from a beacon of an RTLS, and may provide the data to a data acquisition system as part of sensor metadata, while the aircraft sensor of the sensor assembly may provide readings on apparatus vibration, acceleration, or the like. The data acquisition system may then determine whether the readings are responsive to a query or task based on the location and orientation data from the meta-sensor, and other parts of the metadata, such as the sensor type. The AR system may use its own orientation to put the orientation data from a particular meta-sensor or RTLS system into a relevant context. For example, if the AR display is tilted at 48 degrees, and the meta-sensor data indicates that the aircraft is tilted at 3 degrees in the opposite direction, the orientation of the AR display relative to the aircraft would be 45 degrees. This system allows the data acquisition system to receive data from sensor assemblies as the sensor assemblies are added to the apparatus without requiring that the sensor assembly be hardwired or otherwise permanently installed in the apparatus, facilitating upgrades, specialty diagnoses, customized data gathering, and the like.

Figure 8A:
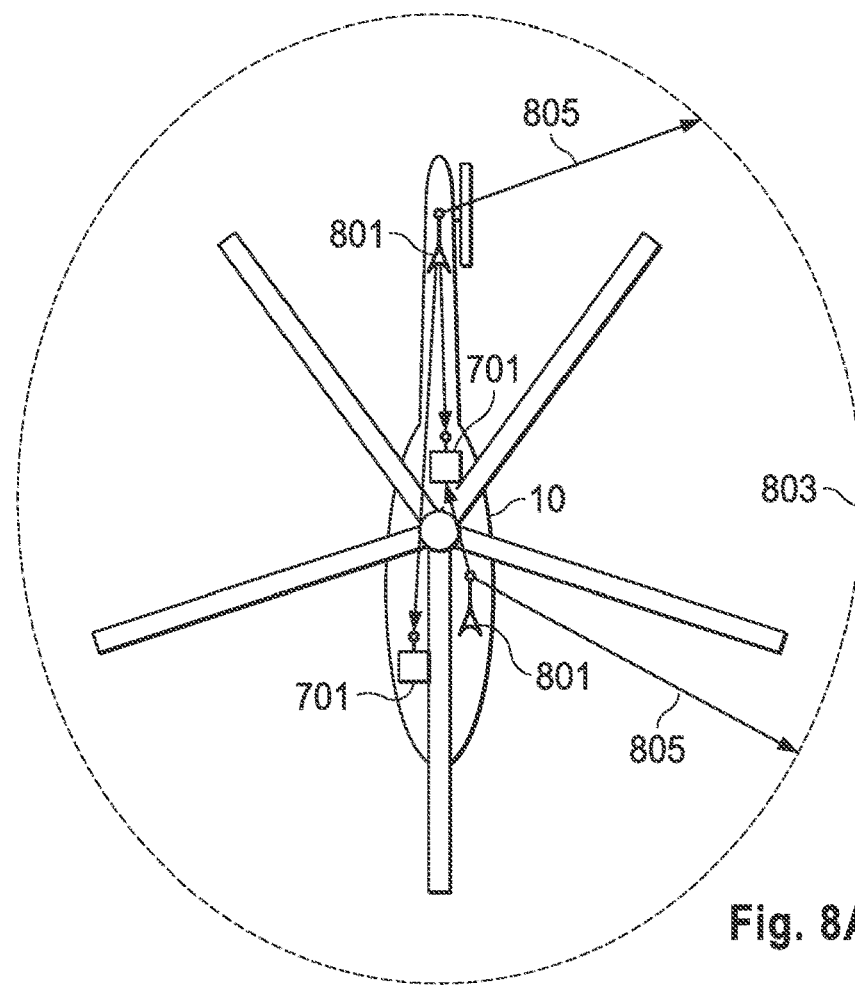
FIG. 8A is a diagram illustrating an equipment RTLS region for a rotorcraft according to some embodiments.

FIG. 8A is a diagram illustrating an equipment RTLS region 803 for a rotorcraft 10 according to some embodiments. The equipment RTLS region 803 may be a region covered by equipment reference signals 805 that are transmitted by one or more equipment beacons 801 of an RTLS system associated with a piece of machinery such as the rotorcraft 10. Deploying a local RTLS that is based on the relevant machinery permits each piece of machinery to have an RTLS when the machinery is deployed in a location without a permanent or fixed RTLS. For example, for highly complex machinery, the RTLS may be used just for the respective piece of machinery, and a larger RTLS may not be needed for any other equipment. Additionally, the machinery may be deployed where installation of a fixed RTLS is impractical, for example, in temporary repair facilities, areas where permanent power is unavailable, or the like. Thus, a military vehicle may be repaired in the field without the need for a permanent or fixed RTLS since the vehicle has a mobile RTLS associated with the vehicle.

In some embodiments, the RTLS allows devices such as an AR display or meta-sensor 701 identify their location with respect to the equipment beacons 801. For example, a meta-sensor 701 may detect one or more reference signals 805 from one or more associated equipment beacons 801, and use the reference signals 805 to determine the location of the meta-sensor 701. An AR display may similarly detect its position relative to the equipment beacons 801. The meta-sensor 701 or AR display may, use, for example, a time-of-flight (ToF), time-difference-of-arrival (TDoA), two-way ranging (TWR), signal strength or relative signal strength (SS/RSS), triangulation based on satellite-based ranging methods such as global positioning system (GPS) carrier wave phasing, or another ranging technique, to determine the distance between the meta-sensor 701 or AR display and one or more of the equipment beacons 801 based on the received reference signals 805. The meta-sensor 701 or AR display may then determine its location relative to the equipment beacons 801 by triangulation. In other embodiments, the equipment beacons 801 may detect the location of each meta-sensor 701. For example, a meta-sensor 701 may be a query-based system that responds to queries from the equipment beacons 801, and the data acquisition system may use return signals sent by the meta-sensors 701 to different equipment beacons 801 to determine the location of each meta-sensor 701 with respect to the equipment beacons 801. In yet other embodiments, the data acquisition system may use a two-way ranging protocol, where equipment beacons 801 query meta-sensors 701, or where the meta-sensors 701 initiate ranging with the equipment beacons 801. The equipment beacons 801 and meta-sensors communicate, and the messaging of the communications is used to determine the range of the meta-sensor 701 to the beacons 801, with both the meta-sensors 701 and equipment beacons 801 determining the relevant ranges.

The lightweight digital representation may include data indicating physical or structural characteristics, such as the location, size, shape, materials, status, and the like, of each element or feature of the equipment represented by the lightweight digital representation. Thus, the lightweight digital representation indicate the placement of each part that may be subject to maintenance, replacement, inspection, or the like when engineering processes are performed. The lightweight digital representation may then be used to locate each part in the equipment with respect to the meta-sensors 701. The AR display may use the location data from the meta-sensors 701 to determine the alignment and location of each element in the lightweight digital representation, since the AR display may accurately determine the location of the meta-sensors in relation to the location context or RTLS, determine the location of the sensor within the lightweight digital representation, and determine the location of features of the lightweight digital representation according to the locations of the meta-sensors. Thus, the AR display may determine the relationship of the location of the AR display to location of the process element using the location of, or location data from, the meta-sensors 701.

Figure 8B:
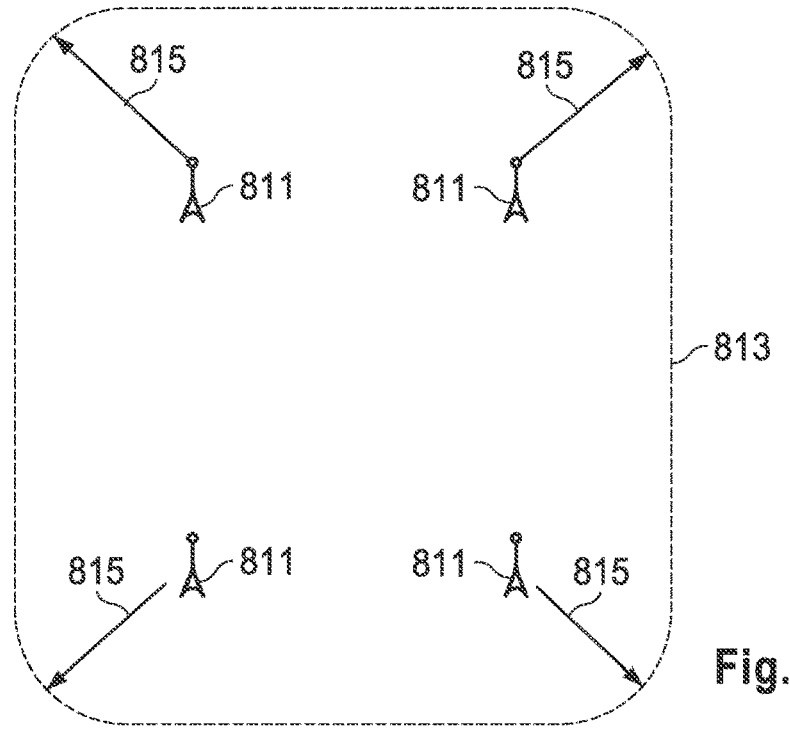
FIG. 8B is a diagram illustrating a fixed area RTLS region for a fixed or area RTLS according to some embodiments.

FIG. 8B is a diagram illustrating a fixed area RTLS region 813 for a fixed or area RTLS according to some embodiments. One or more area beacons 811 may be disposed, for example, in a shop, on a tarmac, equipment bay, warehouse, or the like. Each of the fixed beacons 811 transmits a fixed area reference signal 815 to provide RTLS coverage in the fixed area RTLS region 813. The fixed area RTLS region 813 permits meta sensors 701 that enter the fixed area RTLS region 813 to determine their location relative to the fixed area beacons 811.

Figure 9:
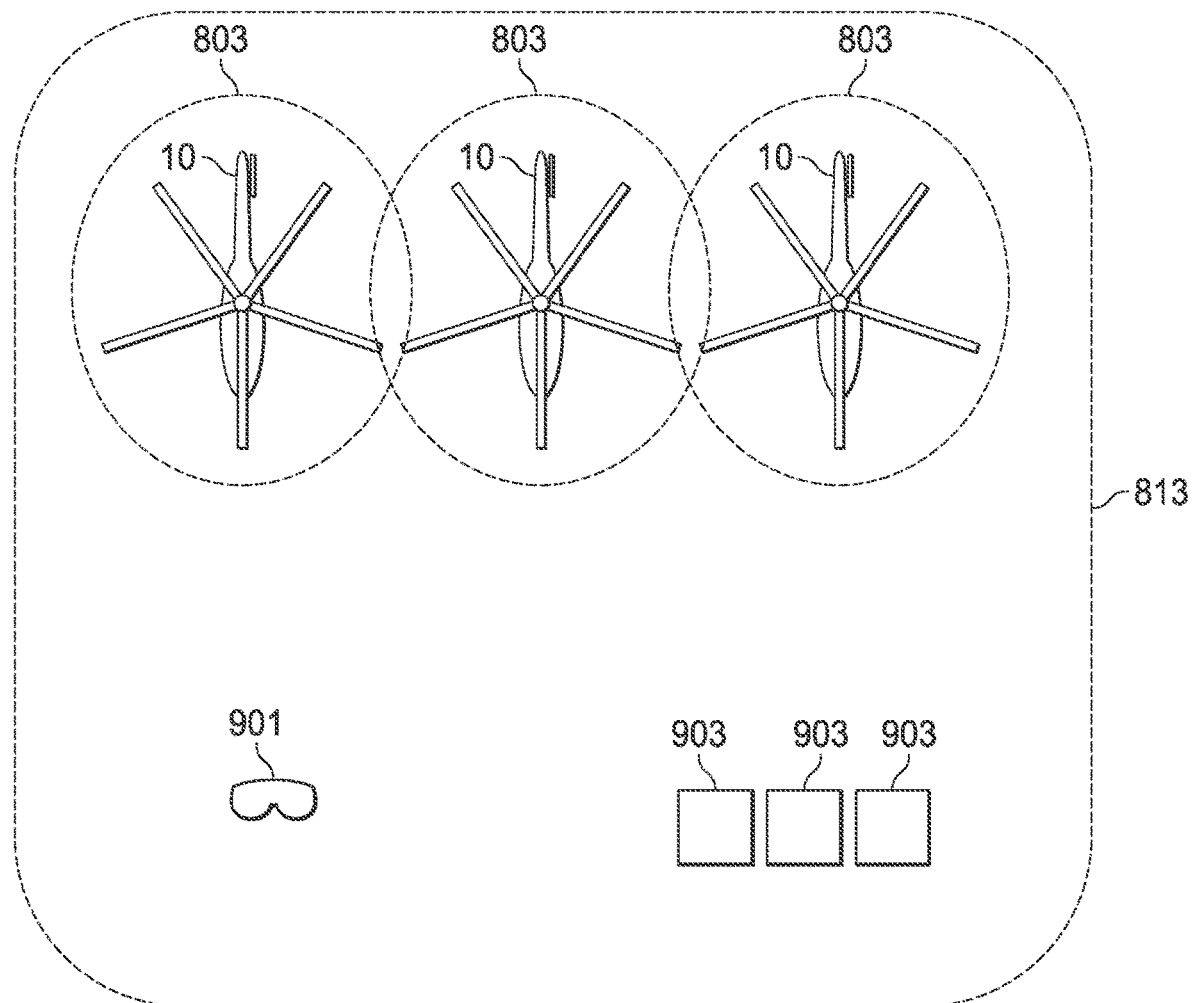
FIG. 9 is a diagram illustrating multiple equipment RTLS regions 803 overlapping with a fixed area RTLS region according to some embodiments.

FIG. 9 is a diagram illustrating multiple equipment RTLS regions 803 overlapping with a fixed area RTLS region 813 according to some embodiments. In some embodiments, one or more equipment RTLS regions 803 may overlap with, or be complete disposed within a fixed area RTLS region 813. For example, in a shop setting, multiple rotorcraft 10 may be in the manufacturing or undergoing maintenance procedures, and may be disposed on a shop or warehouse floor within a fixed area RTLS region 813 of the shop or warehouse. Each rotorcraft 10 may have a separate equipment RTLS region 803, and the equipment RTLS regions 803 may also overlap each other. Due to the number of RTLS regions 803 and 813, a user may pair an AR display 901 with one or more RTLS regions 803 and 813 by selecting an RTLS as a relevant context so that displayed data is displayed with respect to the associated equipment. In some embodiments, the user may select multiple RTLS contexts for the AR display to provide a blend of data. Thus, the AR display 901 may be commanded to display data related to both a rotorcraft 10 and target equipment 903 that is outside of the equipment RTLS region 803 of the selected rotorcraft 10, but that is within a fixed area RTLS region 813. The fixed area RTLS 813 may permit the AR display 901 to receive location data for the target equipment 903. For example, where target equipment 903 is identified with a part or serial number, the AR display 901 may be commanded to associate the identified target equipment 903 with a rotorcraft 10 to be repaired, and may highlight or otherwise indicate the correct target equipment 903 to the user according to the location of the target equipment 903 determined in relation to the fixed area RTLS region 813. The AR display 901 may also indicate the selected rotorcraft, and any engineering procedure data related to the target equipment 903 for installation, replacement, or the like.

Figure 10A:
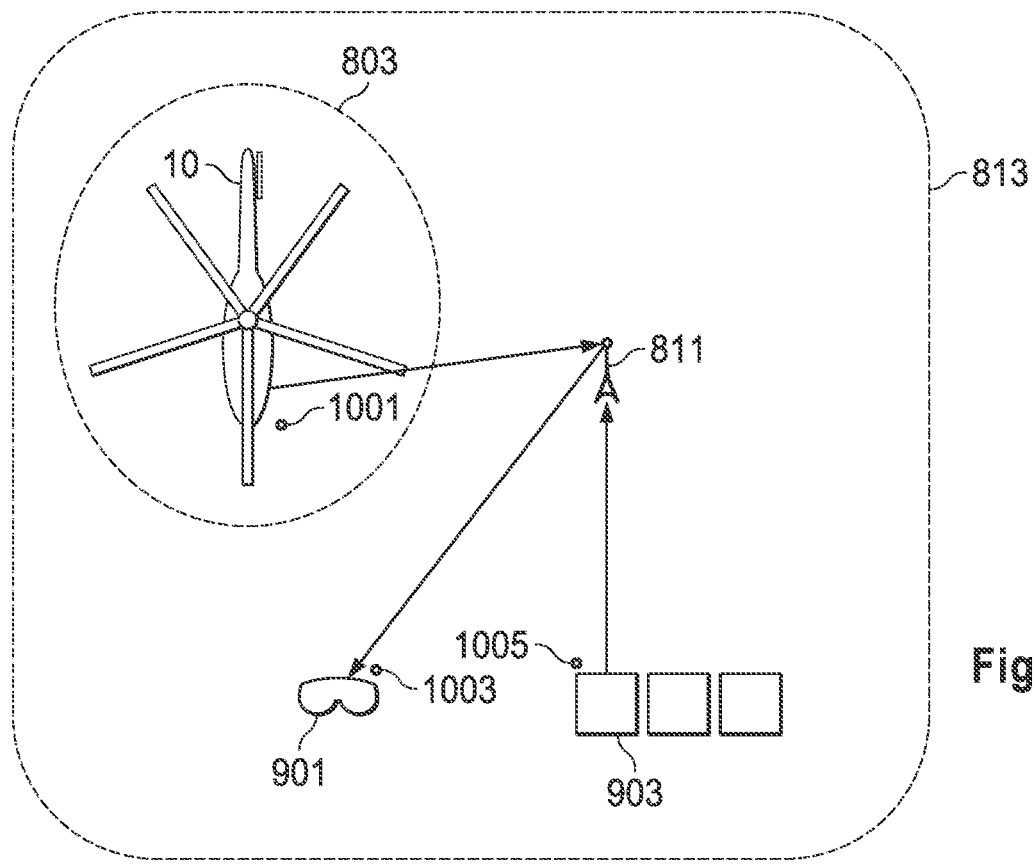
FIG. 10A is a diagram illustrating operation of an AR display outside of an equipment RTLS region for a rotorcraft according to some embodiments.
Figure 10B:
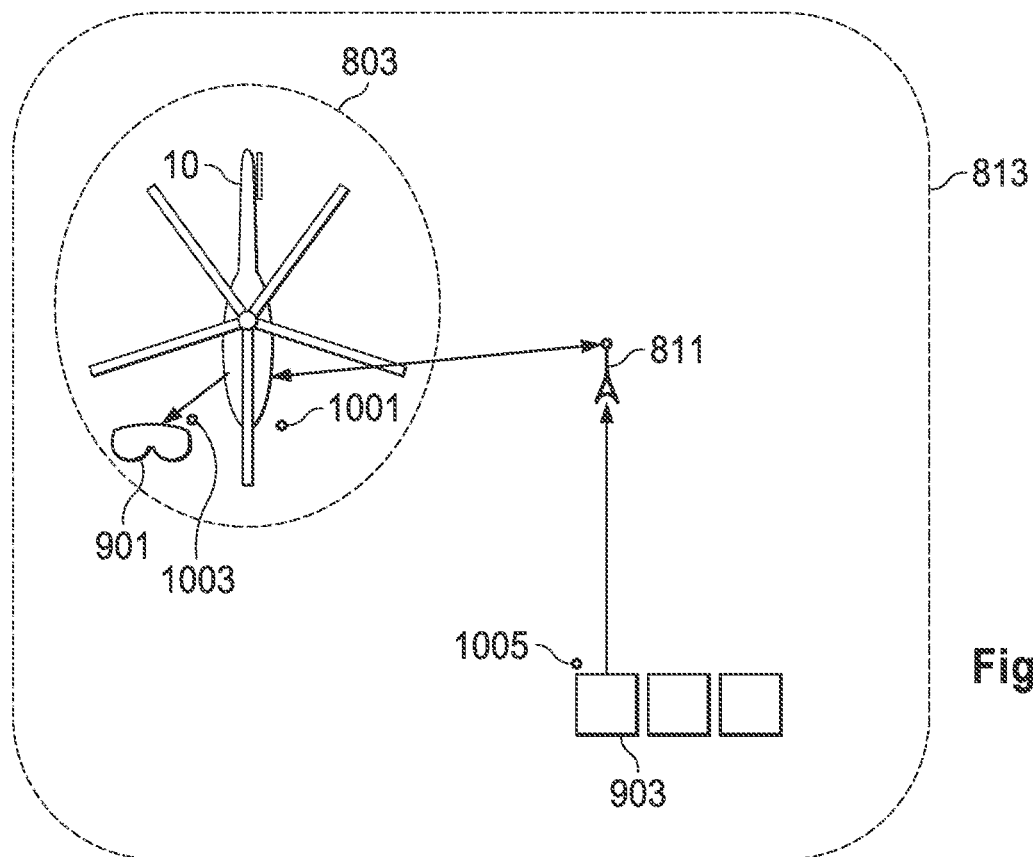
FIG. 10B is a diagram illustrating operation of an AR display within of an equipment RTLS region for a rotorcraft 10 according to some embodiments.
Figure 10C:
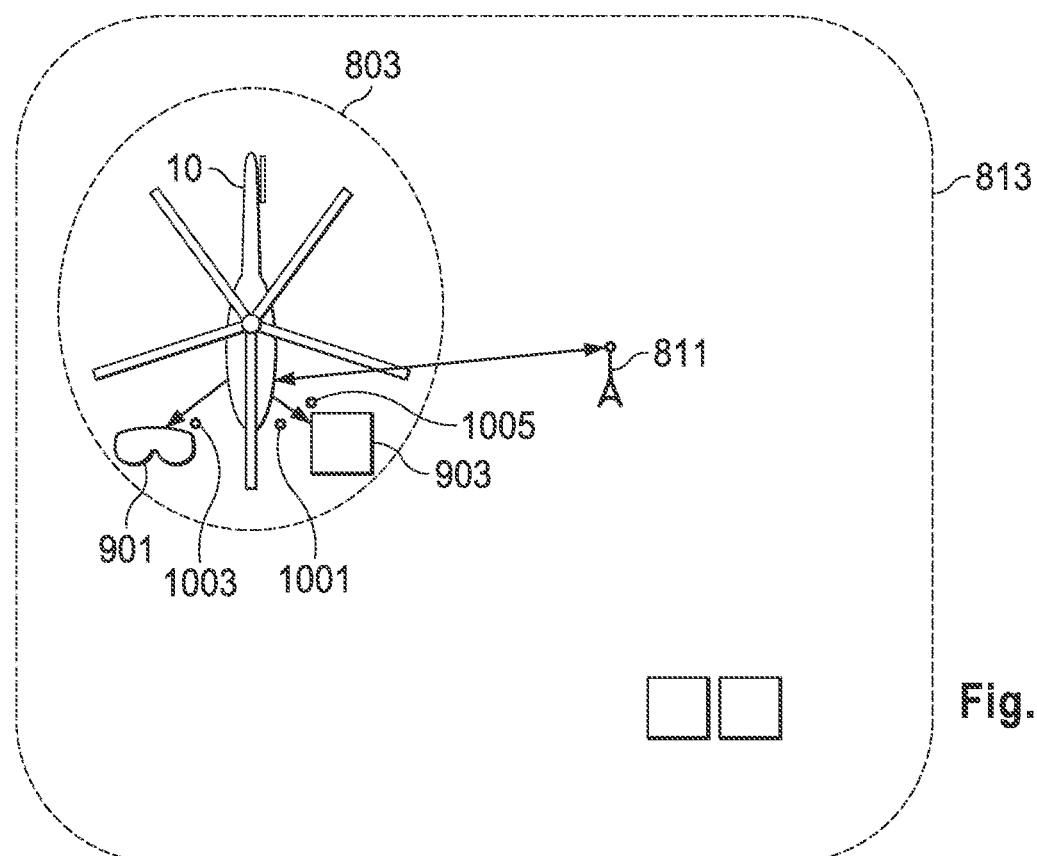
FIG. 10C is a diagram illustrating operation of an AR display with target equipment 903 within of an equipment RTLS region for a rotorcraft according to some embodiments.

The AR display 901 may determine its location from one or more beacons 801 and 811, from RTLSs that are different from the beacon 801 and 811, or from an RTLS providing ranging for a meta-sensor. The AR display 901 may also receive location data directly from a meta-sensor 701, or the location data may be relayed through, or reported by one or more beacons 801 and 811 or another system of the relevant equipment such as a data acquisition system. Thus, the AR display 901 may receive location data for a meta-sensor 701 that is outside of the reception range of the AR display 901. FIGS. 10A through 10C illustrate various scenarios where meta-sensors 701 and an AR display 901 reference different RTLS contexts.

FIG. 10A is a diagram illustrating operation of an AR display 901 outside of an equipment RTLS region 803 for a rotorcraft according to some embodiments. A rotorcraft 10 may be at a first location 1001 and may have an RTLS providing an equipment RTLS region 803. Location data for one or more of the meta-sensors 701 (not shown for clarity) of the rotorcraft 10 may be determined in relation to a fixed beacon 811 of the fixed RTLS region 813, according to a GPS location or ranging, according to magnetometer data, or a combination of the same. While a single fixed beacon 811 is illustrated here for clarity, it should be understood that each meta-sensor 701 may perform ranging with multiple fixed beacons 811 for triangulation. Additionally, in some embodiments, the meta-sensors 701 may use GPS positioning or ranging, or a combination of GPS and RTLS ranging and positioning. In some embodiments, the meta-sensors 701 on the rotorcraft 10 may use the equipment RTLS as an intermediate location context, with the location of the meta-sensors 701 determined in relation to beacons of the equipment RTLS, and a location of the equipment beacons of the equipment RTLS determined in relation to the fixed beacon 811. The location of the meta-sensors 701 with respect to the fixed beacon 811 may then be determined.

The AR display 901 may be at a second location 1003 that is outside the equipment RTLS region 803, and target equipment 903 may be at a third location 1005 outside of the equipment RTLS region 803, and location data for each may be determined in relation to one or more fixed beacons 811 for each of the AR display 901 and target equipment 903. In some embodiments, the AR display 901 determines the range of the AR display 901 from one or more fixed beacons 811, and determines the location of the AR display 901 from the range to the fixed beacon 811 or ranges to different fixed beacons. The AR display 901 may also receive sensor metadata including location data from the rotorcraft 10 or meta-sensors on the rotorcraft 10. The rotorcraft sensor metadata may be received directly from the rotorcraft 10, or relayed through, or sent from, the fixed beacon 811. The AR display 901 may receive the target equipment sensor metadata directly from a meta-sensor on the target equipment 903, or relayed through, or sent from, the fixed beacon 811. In some embodiments where the beacons 801 and 811 determine the range to, or location of, the meta-sensors on the rotorcraft 10 or target equipment 903, for example, where one or more of the meta-sensors are queryable elements, the beacons 801 and 811 or an associate data acquisition system may generate the sensor metadata or data indicating the location of the respective meta-sensor, and send the location data to the AR display 901.

FIG. 10B is a diagram illustrating operation of an AR display 901 within of an equipment RTLS region 803 for a rotorcraft 10 according to some embodiments. When the AR display 901 is at a second location 1003 within the equipment RTLS region 803 of a selected rotorcraft 10, the AR display 901 may use the equipment RTLS region as a reference RTLS or selected context for determining the location of the AR display 901 with respect to the rotorcraft 10. However, when target equipment 903 is at a third location 1005 outside of the equipment RTLS region 803, the selected target equipment 903 may use another RTLS, such as the fixed area RTLS region 813, as the reference RTLS or location context for determining the location of target equipment 903. The location of the target equipment 903 may be determined by using the relationship of the locations of the equipment RTLS beacons and the fixed beacon 811.

FIG. 10C is a diagram illustrating operation of an AR display 901 with target equipment 903 within of an equipment RTLS region 803 for a rotorcraft 10 according to some embodiments. In some embodiments the RTLS of the rotorcraft 10 may provide ranging or relaying of data for the AR display 901 and any target equipment 903 when the AR display 901 is at a second location 1003 that is within the equipment RTLS region 803 and the target equipment 903 is at a third location 1005 that is within the equipment RTLS region 803. The shorter range between the AR display 901 or target equipment 903 and the equipment beacons of the equipment RTLS may provide for more accurate ranging and location. Additionally, the AR display 901 and target equipment 903 may also get location data with respect to the fixed area beacons 811, allowing for more accurate location determination since multiple ranging operations may be performed and the data from different ranging operations may be correlated to increase the accuracy of the overall location determination.

Figure 11:
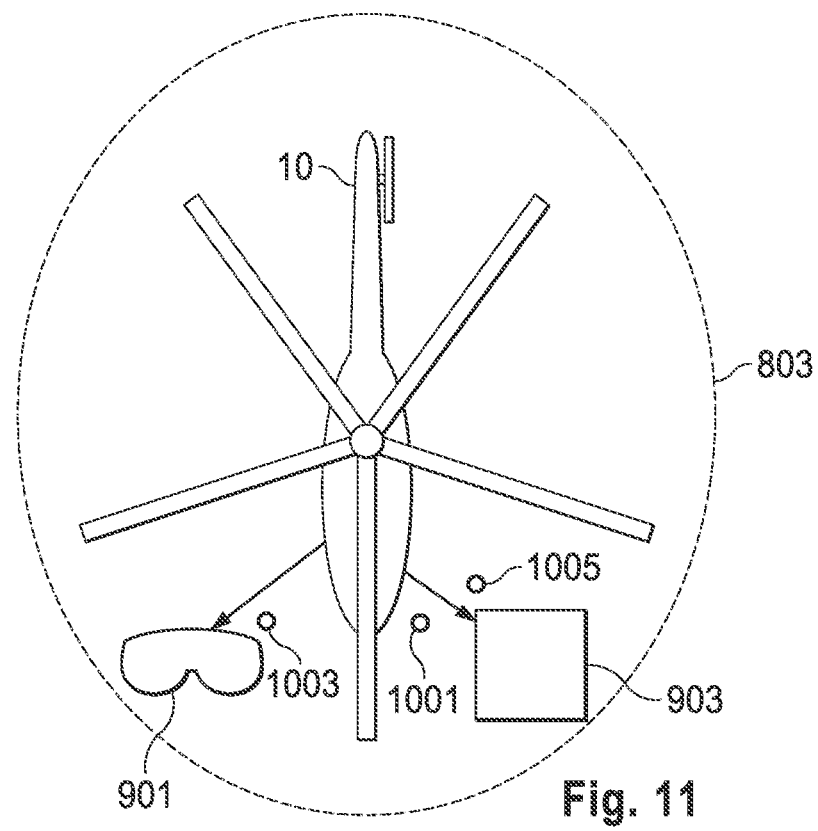
FIG. 11 is a diagram illustrating operation of an AR display with target equipment within of an equipment RTLS region for a rotorcraft according to some embodiments.

FIG. 11 is a diagram illustrating operation of an AR display 901 with target equipment 903 within of an equipment RTLS region 803 for a rotorcraft 10 according to some embodiments. In some embodiments, when the AR display 901 is at a second location 1003 within the equipment RTLS region 803 and the target equipment 903 is at a third location 1005, the equipment RTLS region 803 may provide ranging and location services for the AR display 901 and the target equipment 903 without a fixed area RTLS region 813 (not shown—see FIGS. 10A-10C) or associated fixed area beacons 811 (not shown—see FIGS. 10A-10C).

Figure 12:
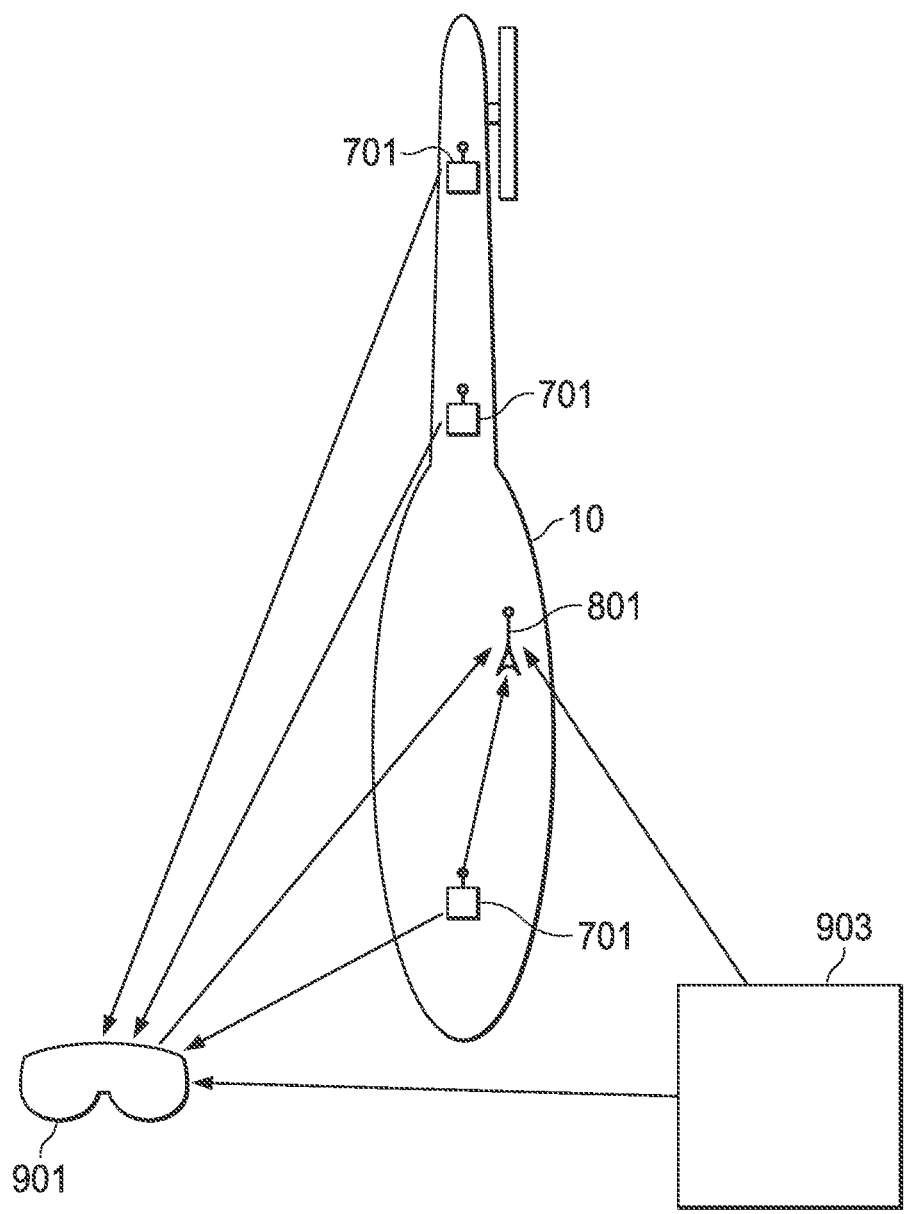
FIG. 12 is a diagram illustrating ranging by an AR display with respect to an equipment beacon of a rotorcraft according to some embodiments.

FIG. 12 is a diagram illustrating ranging by an AR display 901 with respect to an equipment beacon 801 of a rotorcraft 10 according to some embodiments. When a particular RTLS is selected as a reference context or location context for a particular task, the AR display 901 determines its location and orientation with respect to meta-sensors 701 in the rotorcraft 10. This permits the AR display 901 to accurately locate elements on the rotorcraft 10. In some embodiments, the AR display 901 may have a lightweight digital representation 310 of the rotorcraft 10 stored in memory, or otherwise accessible. The AR display 901 may associate elements in, for example, the BOM 314 or the 3D visualization 312 with tasks or technical publications so that the AR display 901 may indicate the associated elements on the rotorcraft or show relevant information in an appropriate location when displaying information from the technical publications 320. The use of the meta-sensors 701 for location and orientation determination permits the AR display 901 to accurately determine the location of the AR display 901 and elements on the rotorcraft 10 to a greater degree than using global positioning system (GPS) or the like. Additionally, using meta-sensors 701, alone, or in combination with a fixed area RTLS, permits a greater accuracy than a fixed rea RTLS alone since the lightweight digital representation 310 of the rotorcraft 10 is individualized for the rotorcraft 10, and the meta-sensors 701 and AR display 901 are able to more accurately determine their relative positions to the rotorcraft 10 since the distances to the equipment bacon 701 are generally smaller than they would be to a fixed area beacon 811.

In some embodiments, the meta-sensors 701 may determine their respective locations with respect to the rotorcraft 10 by performing ranging with one or more equipment beacons 801 of an equipment RTLS associated with the rotorcraft 10. While a single equipment beacon 801 is shown here for clarity, it should be understood that multiple equipment beacons 801 may be part of the equipment RTLS of the rotorcraft 10, and each meta-sensor 701 may perform ranging with one or more equipment beacons 801.

In some embodiments, the meta-sensors 701 may report their location and orientation in the rotorcraft 10 directly to the AR display 901 using for example, a wireless signal such a Bluetooth signal, WiFi signal, or the like. The meta-sensors 701 may include the location and orientation data as location data in, for example, sensor metadata, or the like. In other embodiments, the meta-sensors 701 may provide their location data to the RTLS, data acquisition system, or another system on the rotorcraft, and the location data may be provided indirectly to the AR display 901 for one or more equipment sensors through, for example, the RTLS equipment beacon 801, or through another wireless transmission from a data collection system, or the like.

In some embodiments, the AR display 901 may receive the broadcast messages carrying the location data of the meta-sensors 701. In other embodiments, the AR display 901 may request the location data from the meta-sensors 701 or from the RTLS, and the request may include authentication information or other security information that permits the RTLS to verify that the AR display 901 is authorized to connect to the RTLS. Additionally, the RTLS or another security system may keep the meta-sensors 701 inactive until an authorized AR display 901 connects to the RTLS to avoid unnecessary electromagnetic frequency (EMF) noise and reduce the EMF signature of the rotorcraft.

In some embodiments, the AR display 901 uses location data of each meta-sensor 701 from which the AR display 901 receives location data to generate a data overlay. In other embodiments, the RTLS may indicate the available equipment meta-sensors 701 on the rotorcraft to the AR display 901, and the AR display 901 may compare the equipment meta-sensors 701 from which location data is received to the indicated available equipment meta-sensors, and may further refine the location of the AR display 901 with respect to the rotorcraft 10 and equipment beacon 801 by determining which equipment meta-sensors 701 are blocked by portions of the rotorcraft or otherwise unable to transmit directly to the AR display 901.

One or more pieces of target equipment 903 may also determine their respective location and orientation with respect to the equipment beacons 801 and may transmit the location data to the AR display 901 directly, through the RTLS, or through another system.

Figure 13A:
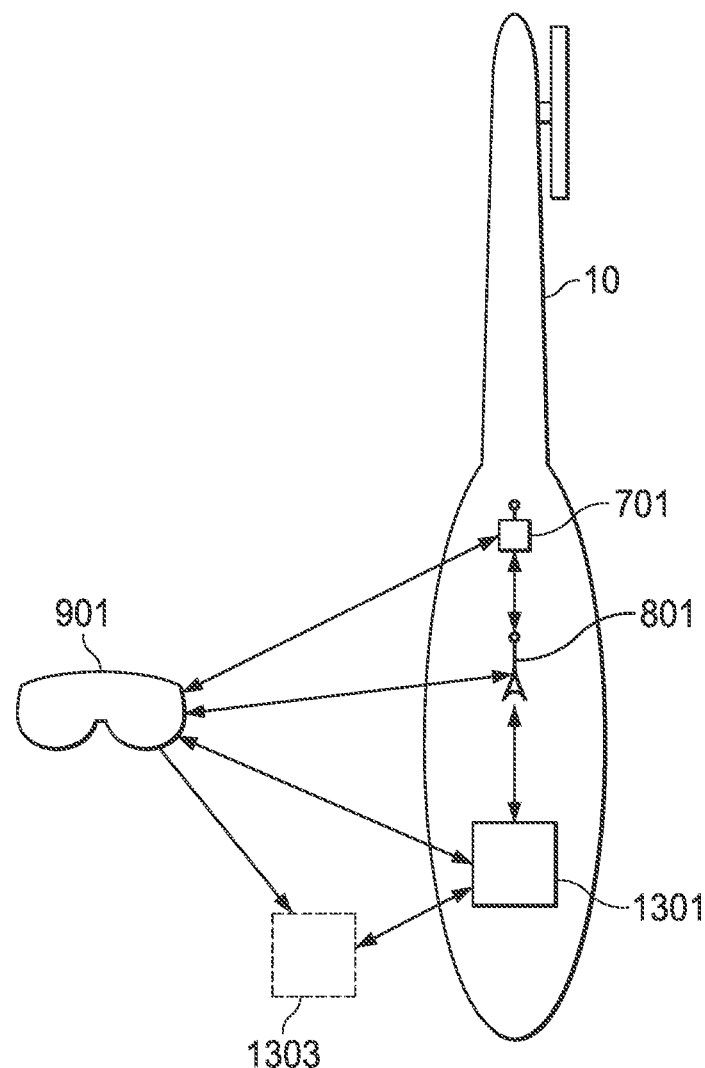
FIG. 13A is a diagram illustrating display of overlay data by an AR display according to some embodiments.

FIG. 13A is a diagram illustrating display of equipment overlay 1303 by an AR display 901 according to some embodiments. In some embodiments, the AR display 901 determines the location of the AR display 901 with respect to the rotorcraft 10 according to the AR display's location with respect to the equipment beacon 801 and the location of the equipment meta-sensors 701. The AR display 901 then determines overlay data that needs to be displayed according to a selected engineering process. The selected engineering process may be an engineering process selected from a technical publication 320 associated with the rotorcraft 10. The AR display 901 may determine, for example, a process element 1301 that is part that is subject of, or will be used during, the selected engineering process, and may display data for an equipment overlay 1303 to a user. In some embodiments, the AR display 901 uses the individualized equipment data to determine where the process element 1301 is located in the rotorcraft, and then uses the location of the AR display 901 with respect to the equipment meta-sensors 701 and equipment RTLS to determine where the equipment overlay 1303 should be displayed. The equipment overlay 1303 may be displayed in an overlay mode where the equipment overlay 1303 is shown on, or around, the process element 1301 so that the AR display 901 highlights the actual element that a technician should work on as part of the selected engineering process. The equipment overlay 1303 may also be displayed in a compare mode where the AR display 901 shows the equipment overlay next to the relevant process element 1301 so that a technician may compare the technical data provided by the AR display 901 to the live view of the process element 1301.

In some embodiments, the AR display 901 may use engineering data from the individualized equipment data, for example, the lightweight digital representation 310 of the rotorcraft, to determine the outer surfaces of the rotorcraft or of the process element to determine where the equipment overlay 1303 should be displayed or anchored. The location data from the meta-sensors 701 and the location data of the AR display 901 allows the AR display 901 to accurately determine the location of each element in the rotorcraft from the engineering data, and thus, accurately determine the location of the AR display 901 with respect to each part of the rotorcraft so that small parts may be accurately highlighted in overlay mode. Additionally, when in compare mode, the equipment overlay 1303 may be accurately anchored in a stable, predicable position that is separated from the rotorcraft or process element 1301.

Figure 13B:
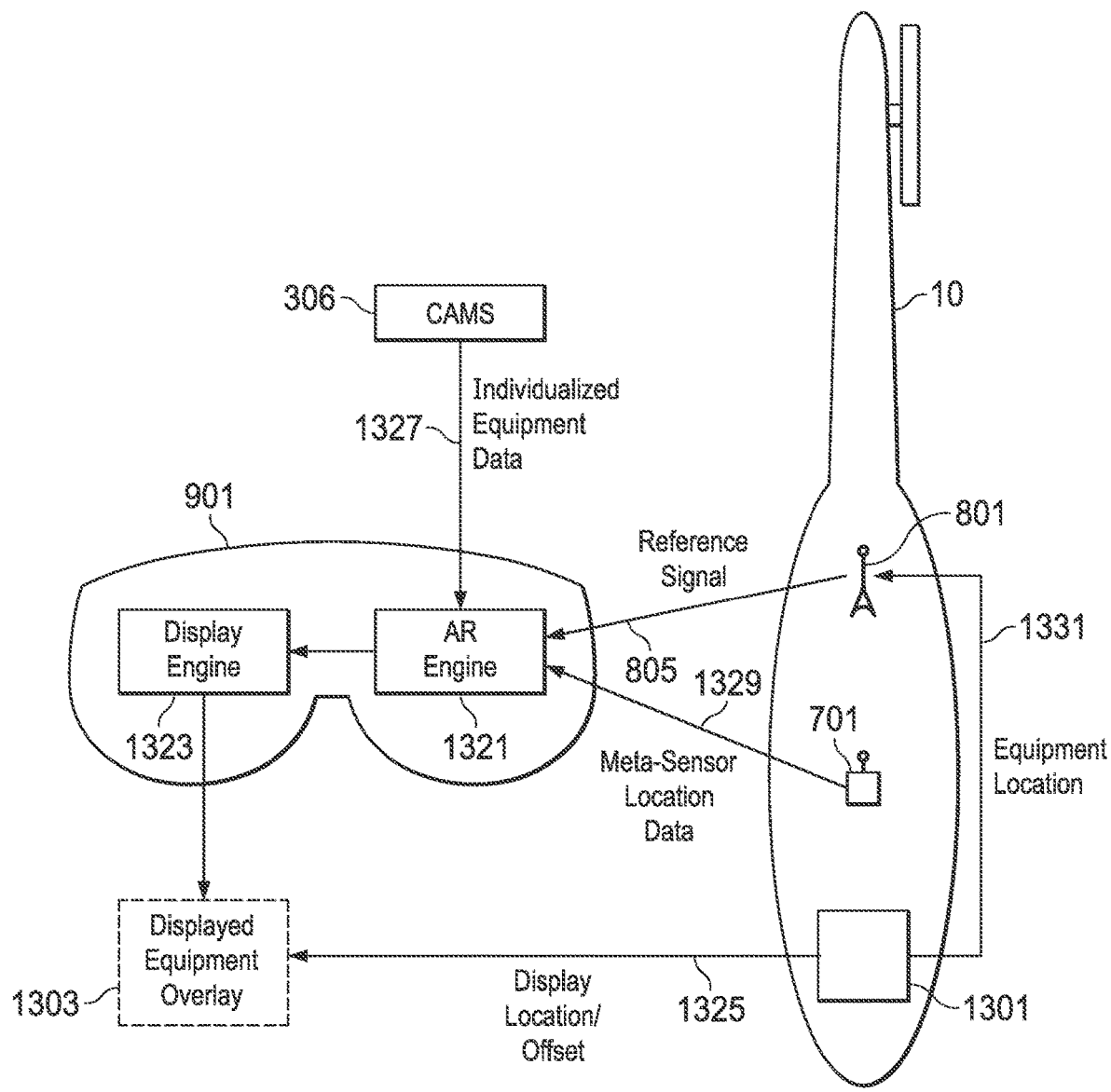
FIG. 13B is a diagram illustrating data exchange for display of overlay data by an AR display according to some embodiments.

FIG. 13B is a diagram illustrating data exchange for display of an equipment overlay 1303 by an AR display 901 according to some embodiments. In some embodiments. The AR display 901 has a processor and non-transitory computer readable medium storing instructions for displaying equipment overlay 1303 data. The AR display 901 may have an AR engine 1321 that handles communication, receiving and storing data, location determination, and model determination. The AR engine 1321 may receive individualized equipment data by a first transmission 1327. In some embodiments, the AR display 901 may receive the individualized equipment data directly from the CAMS 306 on the rotorcraft 10, or may receive the individualized equipment data from another source such as a server, cloud service, maintenance system, or the like. The AR display 901 may then use the individualized equipment data to determine a selected engineering process. For example, the AR display 901 may identify an engineering process selected by a user from technical publications 320 of the rotorcraft 10 that are included in the individualized equipment data.

The AR engine 1321 may determine the equipment data to be displayed as part of the equipment overlay 1303, and determine an equipment location 1331 of the process element with respect to the equipment beacon 801. The AR display 901 receives meta-sensor location data by a second transmission 1329 that may come directly from the meta-sensors 701, or be relayed or sent from the RTLS of the rotorcraft through the equipment beacon 801 or through another system. The AR display 901 also receives a reference signal 805 from one or more equipment beacons 801 at the rotorcraft or from other beacons that provide RTLS services, and uses the reference signal 805 to determine the AR display's range to the associated equipment beacons. The AR display may then determine its location with respect to the equipment beacons 801 from the ranges.

The AR display 901 then uses the meta-sensor location data to determine the equipment location 1331 of the process element according to the received meta-sensor location data and the individualized equipment data. For example, the AR engine 1321 may determine that the first step in a selected engineering process is to remove a bolt listed in a BOM 314 of the individualized equipment data, and may then determine the equipment location 1331 in the rotorcraft 10 for the bolt identified as the process element 1301 using the lightweight digital representation 310 or other parts of the individualized equipment data. The AR display 901 may then use the meta-sensor data and the determined position of the AR display 901 with respect to the equipment beacon 801 to determine the AR display 901 location in relation to the bolt identified as the process element 1301.

The AR engine also determines a display location or offset 1325, and a display engine 1323 may generate the meshes, faces and other visual data to be displayed. The display engine 1323 may use a real time 3-D rendering engine that uses the selected portion of the individualized equipment data to generate associated graphic data for the equipment overlay 1303, and displays the equipment overlay 1303 to a user. In some embodiments where the AR display 901 is an AR headset, the display engine 1323 may cause a display interface to project the displayed equipment overlay 1303 on the eyepieces of the AR headset so that the displayed equipment overlay 1303 is shown at the selected display location in relation to a live view of the process element 1301. Thus, the displayed equipment overlay 1303 is shown aligned with the live view of the process element 1301, as in an overlay display mode, or with the selected display being offset from the live view of the relevant process element 1301, as in the compare display mode. This permits the user to see the actual rotorcraft through the eyepieces with the overlay data projected on the eyepieces to generate the AR picture. In other embodiments where the AR display 901 is, for example, a tablet, the display engine 1323 may cause a display interface show live data from the area behind the display using data taken, from, for example, a camera on the AR display 901. The AR display may combine the live feed from the camera with the equipment overlay 1303.

Figure 14A:
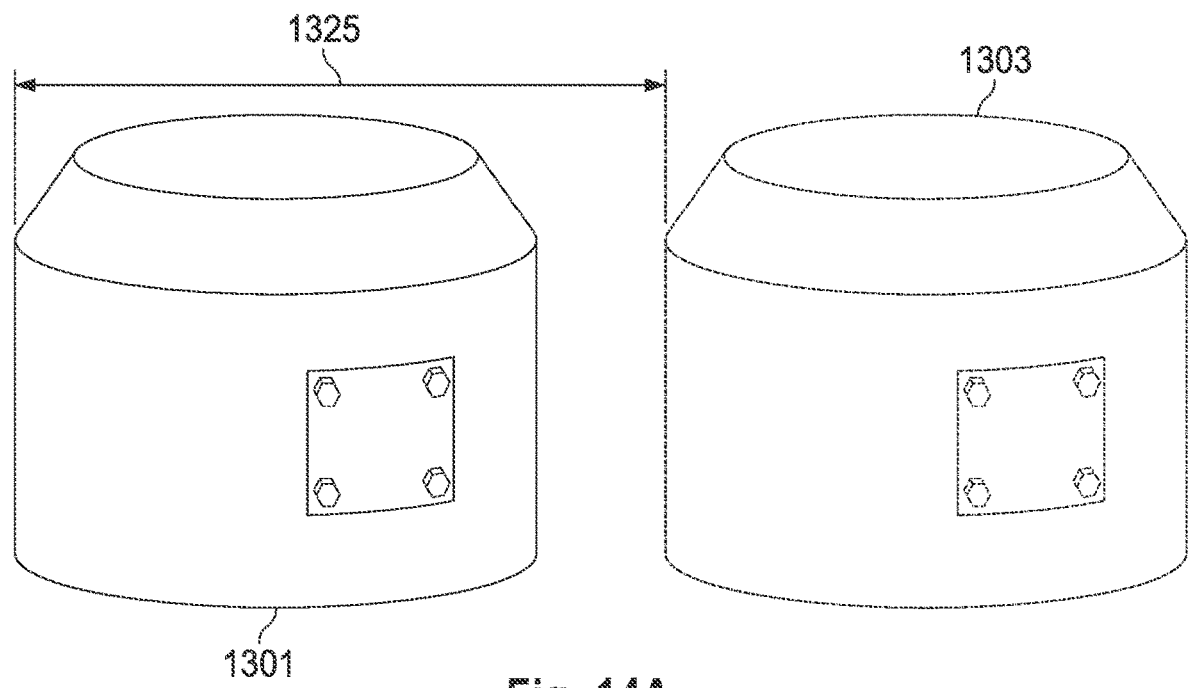
FIG. 14A is a diagram illustrating a compare mode display of an equipment overlay according to some embodiments.

FIG. 14A is a diagram illustrating a compare mode display of an equipment overlay 1303 according to some embodiments. In some embodiments, the AR display 901 may display the equipment overlay 1303 as a digital representation of the selected process element 1301. In a compare mode, the AR display 901 may display the equipment overlay 1303 separate from the selected process element 1301 so that a technician may see, for example, what a completed part looks like, or so that the equipment overlay 1303 does not interfere with the technician's view of the selected process element 1301. In the compare mode, the AR display 901 may determine the bounds of the rotorcraft 10, process element 1301, or other parts, and may select a display location or offset 1325 for the overlay data that is great enough to prevent the equipment overlay 1303 from being shown on top of an unrelated part.

Figure 14B:
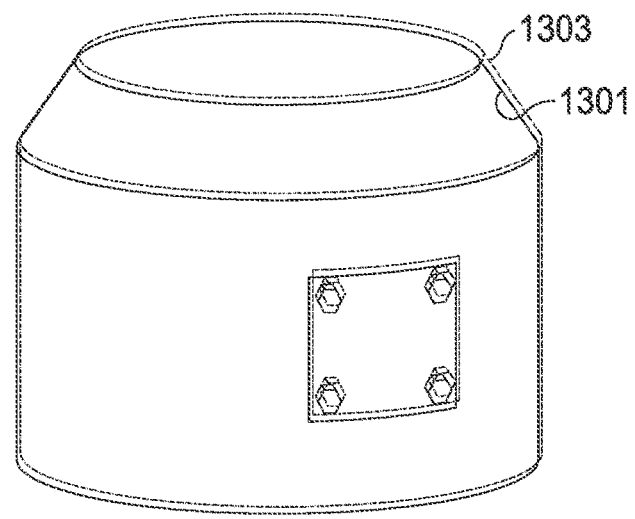
FIG. 14B is a diagram illustrating an overlay mode display of an equipment overlay according to some embodiments.

FIG. 14B is a diagram illustrating an overlay mode display of an equipment overlay 1303 according to some embodiments. In the overlay mode, the AR display 901 may display the equipment overlay as close to the relevant process element 1301 as possible so the equipment overlay appears to be part of the process element 1301 or highlights a specific process element 1301. In the overlay mode, the AR display 901 may determine the bounds of the rotorcraft 10, process element 1301, or other parts, and may select a display location or offset 1325 for the overlay data that as close to zero as possible so that the equipment overlay 1303 is accurately aligned with the surfaces or features of the process element 1301.

Figure 15A:
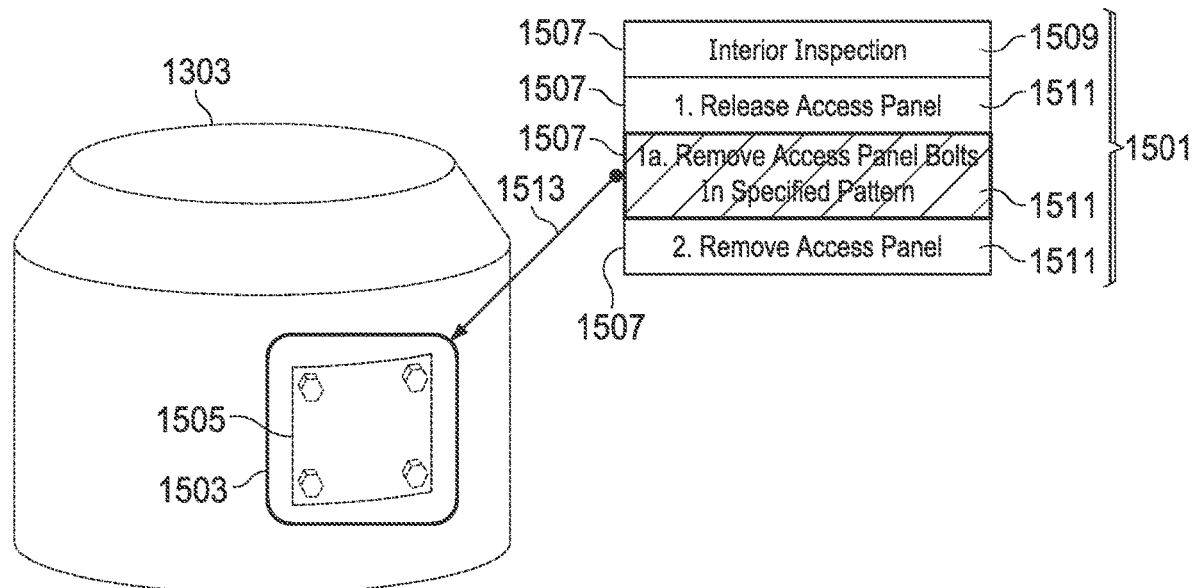
FIG. 15A is a diagram illustrating display of overlay instructional data according to some embodiments.

FIG. 15A is a diagram illustrating display of overlay instructional data 1501 according to some embodiments. The AR display 901 may display data in addition to the equipment overlay 1303 for the process element 1301. In some embodiments, the AR display 901 may display overlay instructional data 1501 that highlights a process element feature 1505 in order to provide accurate details on how an engineering process should be accomplished. For example, in some embodiments, the overlay instructional data 1501 includes data taken from the technical publications 320 for the selected engineering process to provide detail walking a technician through the selected engineering process. The overlay instructional data 1501 may include one or more text features 1507, an overlay highlight 1503, or one or more overlay indicators 1513. The text features 1507 may include, for example, title text 1509 indicating the engineering process, and may also include process step data 1511 with information taken from the individualized equipment data. An overlay highlight 1503 may be displayed over a process element feature 1505 to highlight a particular element of, for example, the equipment overlay 1303 or a process element 1301. Additionally, overlay indicators 1513 may specify the process element feature 1505 or identify which process step data 1511 is associated with a particular overlay highlight 1503.

Figure 15B:
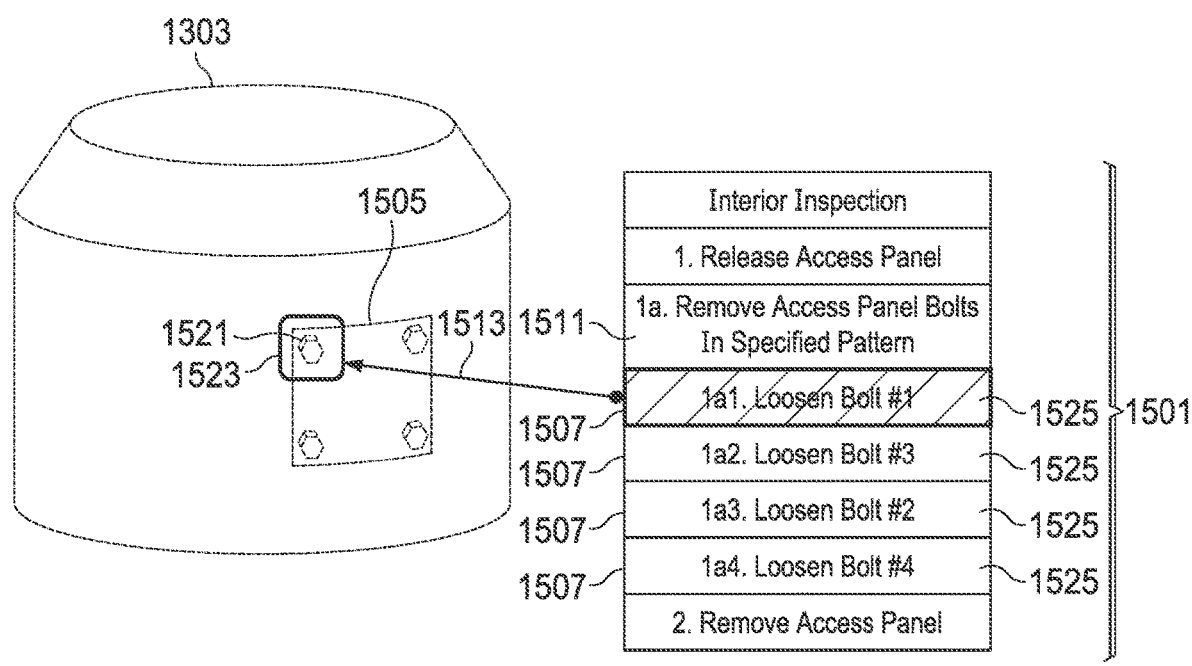
FIG. 15B is a diagram illustrating display of overlay instructional data according to some embodiments.

FIG. 15B is a diagram illustrating display of overlay instructional data 1501 according to some embodiments. In some embodiments, the AR display 901 may display text features 1507 that include process step data 1511 and process sub-step data 1525. The process sub-step data 1525 may include data with additional details for some process step data 1511. Additionally, the sub-step data 1525 may be associated with an overlay detail highlight 1523 displayed to highlight a process element detail feature 1521 and may highlight a specific element of the equipment overlay 1303 or a process element 1301. The overlay indicator 1513 may also specify the process element feature 1505 or identify which the process sub-step data 1525 is associated with a particular overlay detail highlight 1523.

In some embodiments, the overlay instructional data 1501 may be displayed in relation to the equipment overlay 1303, process element 1301, and other parts of the equipment so that the overlay instructional data 1501 avoids blocking a user's view of relevant features. In some embodiments, the location of the rotorcraft or equipment in the AR display 901 field of view is determined according to the location of the AR display 901, the location data from the meta-sensors 701, and the lightweight digital representation 310 of the rotorcraft 10. The AR display 901 may position the overlay instructional data 1501 according to the location of the rotorcraft 10 or equipment so that the overlay instructional data 1501 is separated from, spaced apart from, or otherwise avoids covering, selected portions of the rotorcraft or equipment.

Figure 16A:
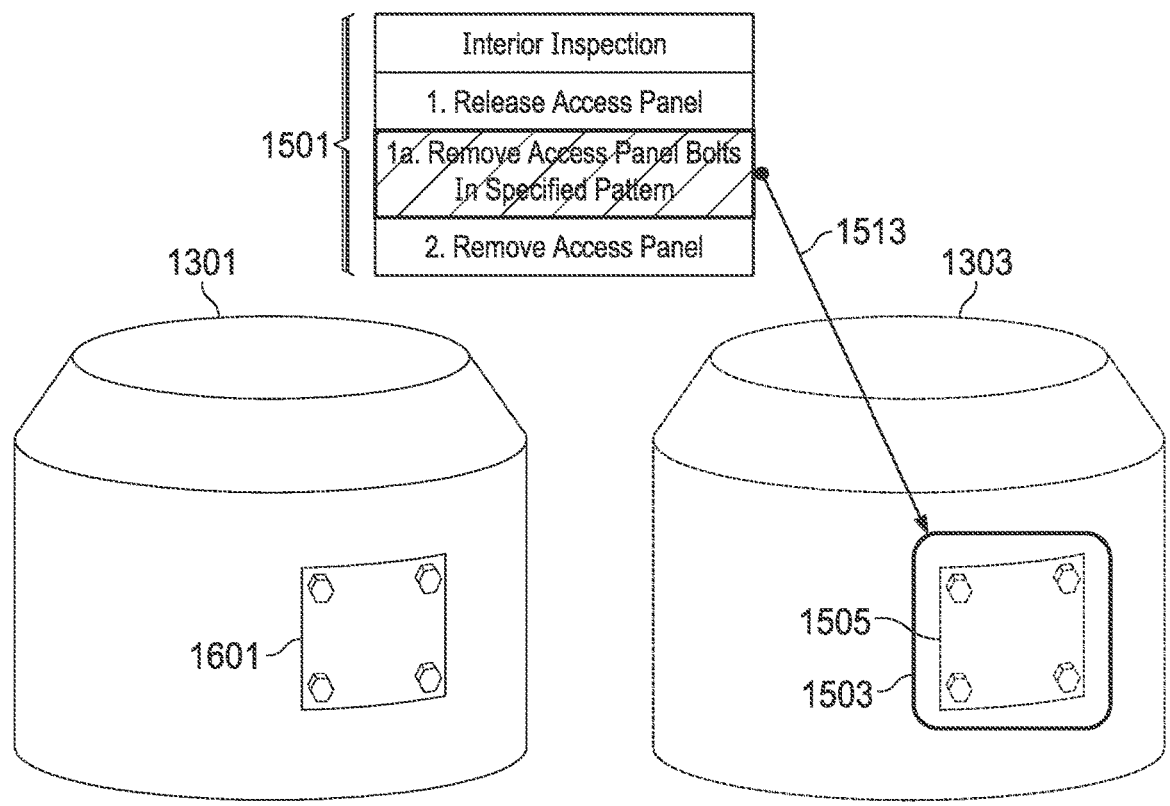
FIG. 16A is a diagram illustrating display of overlay instructional data in a compare mode according to some embodiments.

FIG. 16A is a diagram illustrating display of overlay instructional data 1501 in a compare mode according to some embodiments. In a compare mode, the AR display 901 determines the location of the process element 1301 and the AR display 901 according to at least the location data from the meta-sensors 704 and displays the equipment overlay 1303 at a location separated from the process element 1301. The AR display 901 may also display the overlay instructional data 1501 at a location that is spaced apart from, or separate from, the process element 1301 and the equipment overlay 1303. Notably, the overlay highlight 1503 or overlay indicator 1513 may overlay the displayed equipment overlay 1303 so that the overlay highlight 1503 accurately indicates the process element feature 1505 relevant to the overlay instructional data 1501. However, in the compare mode, the AR display 901 may keep the overlay highlight 1503 and overlay indicator 1513 spaced apart from the process element 1301 in the user's field of view so that the user has a clear view of the process element 1301, and can make an accurate comparison of the equipment overlay 1303 and process element 1301.

Figure 16B:
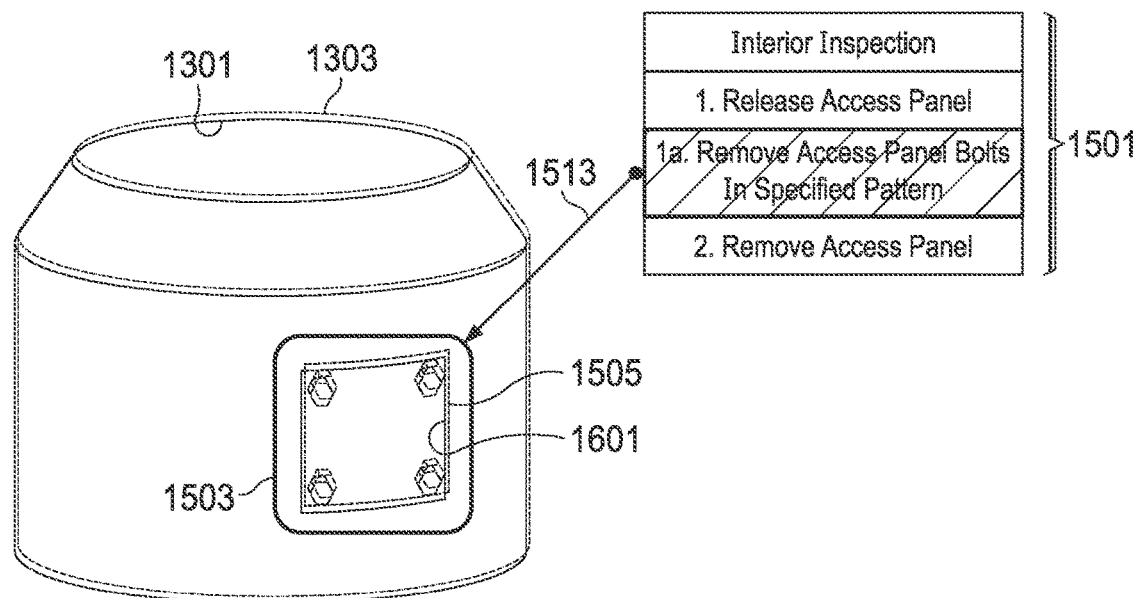
FIG. 16B is a diagram illustrating display of overlay instructional data in an overlay mode according to some embodiments.

FIG. 16B is a diagram illustrating display of overlay instructional data 1501 in an overlay mode according to some embodiments. In the overlay mode, the AR display 901 determines the location of the process element 1301 and the AR display 901 according to at least the location data from the meta-sensors 704 and displays the equipment overlay 1303 at a location that is aligned with the process element 1301. The AR display 901 may also display the overlay instructional data 1501 at a location that is spaced apart from, or separate from the process element 1301 and the equipment overlay 1303. Notably, the overlay highlight 1503 or overlay indicator 1513 may overlay the displayed equipment overlay 1303 and process element 1301 so that the overlay highlight accurately indicates the process element feature 1505 relevant to the overlay instructional data 1501.

In some embodiments, the user may select whether the AR display 901 displays the equipment overlay 1303 in an overlay mode or a compare mode. However, in some embodiments, the AR display 901 may automatically select the compare mode or overlay mode as the active display mode, or may override a user selection of display mode. The AR display 901 may, for example, override a user display mode selection when the AR display 901 needs to highlight detail that may be having a size smaller than the positioning resolution of the AR display 901. Therefore, the AR display 901 may change a display mode if the positioning resolution falls below a threshold, and the threshold may be associated with a feature size or feature spacing from another feature. For example, if the AR display 901 is able to resolve the position of process elements or process element features to within 3 inches, but the relevant process element of process element feature is smaller than 3 inches, or is less than 3 inches from another relevant part, the AR display 901 may automatically switch from overlay mode to compare mode, with the AR display 901 highlighting the equipment overlay 1303 that is shown separately from the live process element 1301, which may avoid the AR display 901 inaccurately highlighting features on the live process element 1301, or highlighting the wrong features.

Figure 17:
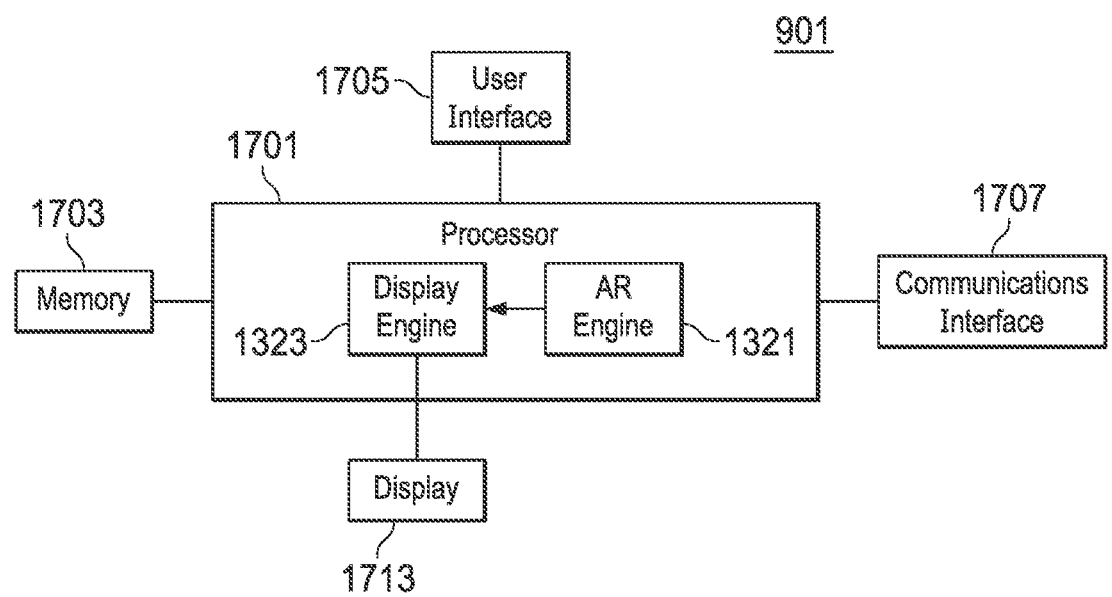
FIG. 17 is a block diagram of an AR display device, in accordance with some embodiments.

FIG. 17 is a block diagram of an AR display 901 device, in accordance with some embodiments. As shown, the AR display 901 includes a processor 1701, a memory 1703, a display 1713, a user interface 1705 and one or more communications interfaces 1707, which may (or may not) be arranged as shown. The processor 1701 may be any component or collection of components adapted to perform computations and/or other processing related tasks, and the memory 1703 may be any component or collection of components that are non-transient computer readable media adapted to store programming and/or instructions for execution by the processor 1701. The programming and/or instructions may include programming for providing the AR engine 1321 and display engine 1323. The AR engine 1321 handles determining the orientation and location mapping for the AR display, determining the location orientation of the meta-sensors and process element in relation to the AR display based on the location and orientation of the AR display, determining the location of overlay data to be displayed and which overlay data should be displayed, and the like. The AR display 901 may determine the orientation or location of the AR display from an orientation sensor, GPS location or ranging, from RTLS ranging, or the like, a combination of the same. In some embodiments, the AR display 901 may have an orientation sensor such as an accelerometer that is used to determine the orientation of the AR display 901, and the AR display may use the AR display location and orientation to determine the position and orientation of the AR display 901 relative to the meta-sensors and process elements. The display engine 1323 may calculate the 3D meshes and facets that are used to generate visual data for the overlay data from the lightweight equipment data, and may use the locations of the AR display 901, the meta-sensors and any process elements to determine what portions of the lightweight equipment data are shown on the display 1713.

The display 1713 may be a projection system or display screen that provides generated visual data that may be viewed in combination with live visual data. In some embodiments, the display 1713 is a projection system that projects generated visual data onto a surface that also allows a user to view live visual data such as an environment surrounding the user. The projection of the generated visual data may be viewed at the same time as the live visual data so that the projected visual data augments the user's view of the environment around the user. In some embodiments, AR display 901 may be a headset, and the display 1713 may project the projected visual data onto eyepieces that a user looks through to see the live visual data from the surrounding environment, as well as the projected visual data.

In other embodiments, the live visual data may be data taken from a camera or the like, and may be combined with the projected visual data to generate a displayed image or video. For example, the AR display 901 may be a tablet system, and a camera in the tablet may acquire an image of the environment in front of the camera, and the AR display 901 may overlay the projected visual data on the live visual data from the camera so that a user sees the live visual data in the display 1713 augmented with the projected visual data.

The communications interfaces 1707 may include wired or wireless interfaces. In some embodiments, the communications interfaces include wireless interfaces that receive individualized equipment data, meta-sensor metadata, location data and the like, and detect or receive reference signals for providing ranging between the AR device and equipment beacons or fixed area beacons.

The user interface 1705 allows a user to interact with the AR display 901. In an embodiment where the AR display 901 is a headset, the user interface 1705 may be a wireless gesture interface, or anther interface such as a glove-based gesture interface, voice interface, a touch screen, or the like. In an embodiment where the AR display 901 is a tablet system, the user interface 1705 may be a touch system, gesture system, mouse, keyboard, or the like. While some examples of user interfaces are described above, it should be understood that any suitable user interface may be used with an AR display 901.

Figure 18:
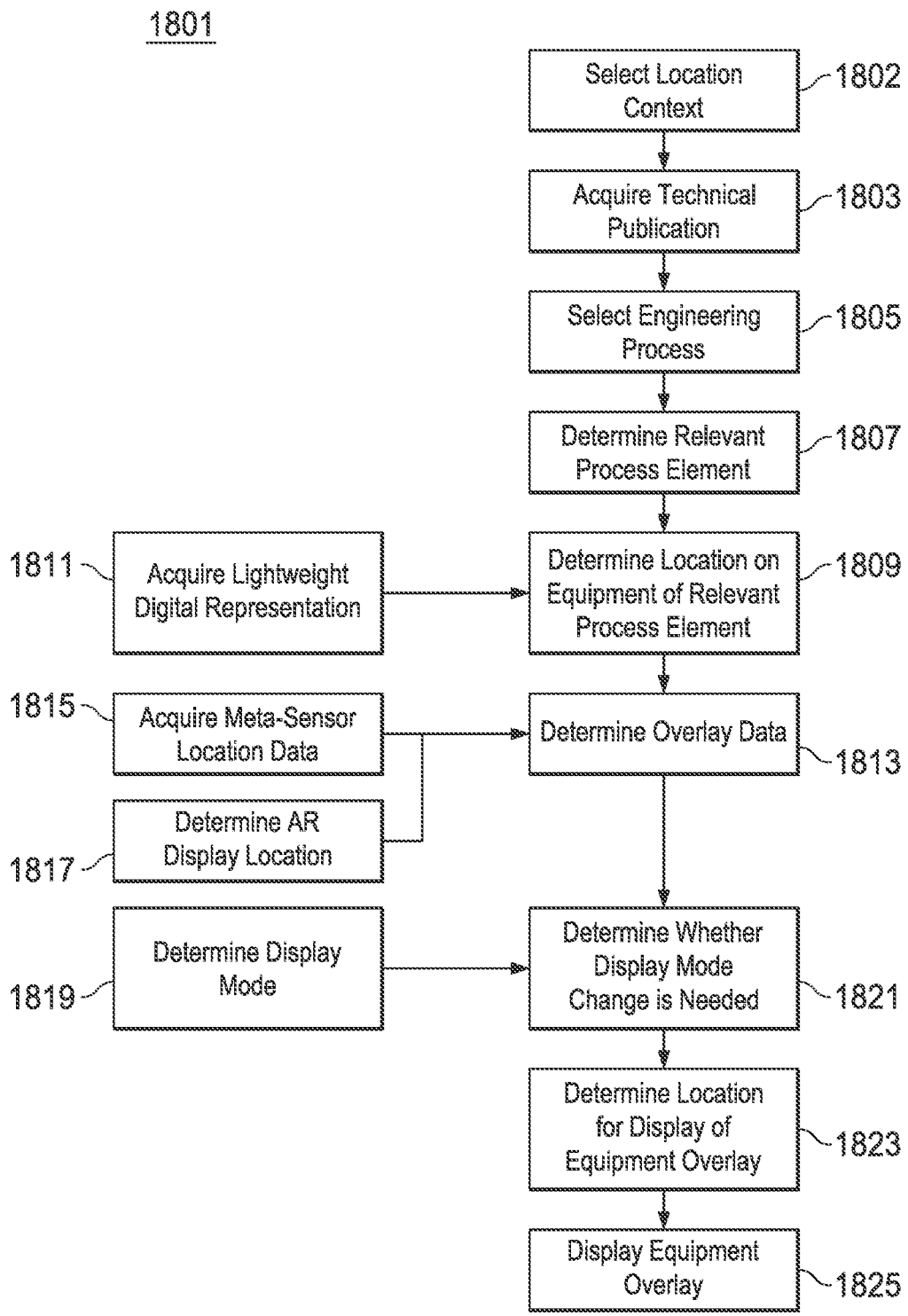
FIG. 18 is a flow diagram illustrating a method for implementing an equipment location and engineering process display system according to some embodiments.

FIG. 18 is a flow diagram illustrating a method 1801 for implementing an equipment location and engineering process display system according to some embodiments. In block 1802, a location context is selected. In some embodiments, the location context may be one or more RTLSs that will provide ranging for an AR display 901, and that are used as references for meta-sensor locations. In some embodiments, the location context is selected, either directly, or indirectly, by a user, and in other embodiments, the location contest is automatically selected by the AR display, or by a server, fleet management system, a piece of equipment, or the like. In some embodiments, the location context may be selected by a user through, for example, the user interface, when the user determines that a particular piece of equipment will be inspected, maintained, or otherwise worked on, with the RTLS for the selected piece of equipment providing the location context for the AR display. In other embodiments, the location context may be indirectly selected by the user when, for example, a user selects to perform a particular engineering process, and the location context may be selected as a result of the selected engineering process. In yet other embodiments, a fleet management system may select a particular maintenance or inspection process to be performed, and may automatically select the location context.

In block 1803, the AR display acquires a technical publication. The AR display 901 may retrieve or receive the technical publications from a CAMS 306, or another system of a piece of equipment such as a rotorcraft. In some embodiments, the technical publications may be received as part of individualized equipment data, or may be received separately from other portions of the individualized equipment data. In block 1805, an engineering process is selected. In some embodiments, the engineering process may be selected from the technical publication, or may be separate from the technical publication. The engineering process may be elected by a user through, for example, the user interface. In other embodiments, the engineering process may be selected indirectly by the user, or automatically selected by the AR display or by an outside system such as the fleet management system or the like.

In block 1807, a relevant process element is determined. In some embodiments, the AR display determines the relevant process element from the selected location context, selected equipment and selected engineering process. The process element may be a portion of the selected equipment that is the subject of the selected engineering process, or may be a separate piece of target equipment. For example, where the selected engineering process is an inspection procedure, a bolt or access panel may be identified as the relevant process element. In another example, where the selected engineering process is an installation procedure, the process element may be a new feature, such a pump, circuit board, or the like, that is to be installed on the selected equipment.

In block 1811, the AR display acquires the lightweight digital representation of the equipment that is the subject of the selected engineering process. In some embodiments, the lightweight digital representation includes data describing the physical characteristics, layout, or the like, of the selected equipment, and may be received as part of the individualized equipment data, or separate from other portions of the individualized equipment data. The lightweight digital representation may be received from a CAMS associated with the selected equipment, from a fleet management system, fixed area RTLS, or the like. In block 1809, the AR display determines the location of the relevant process equipment. In some embodiments where the process element is part of the selected equipment being worked on, the relevant process element may be located from the lightweight digital representation. In other embodiments where the process element is, for example, a piece of target equipment separate from the selected equipment, the AR display may locate the target equipment or process element according to location data of the target equipment.

In block 1815, the AR display acquires meta-sensor location data. The meta-sensor location data is location data indicating a particular meta-sensor's location in the selected piece of equipment, and in some embodiments, may be a location relative to the selected location context. In some embodiments where the meta-sensor is in a location context different from the selected location context, the meta-sensor data may be normalized to reference the selected location context. Thus, if the AR display is in a different RTLS region from the meta-sensor, the meta-sensor data may be relayed to the AR display and may be adjusted to reflect the meta-sensor location with respect to the RTLS region of the AR display. The meta-sensor location data may be included in meta-sensor metadata, which may include the meta-sensor location, rotation, or other physical characteristics of within the RTLS, the type of sensor associated with the meta-sensor, sensor identifiers, sensor capabilities, or the like.

In block 1817, the AR display determines the location of the AR display. In some embodiments, the AR display performs ranging within the selected location context to determine the AR display location with respect to the selected location context. The AR display may detect one or more reference signals from beacons providing RTLS coverage for the selected location context, and may use the range to different beacons to triangulate the AR display position within the location context. Therefore, the AR display may determine the location of the AR display according to the selected location context.

In block 1819, the AR display determines the display mode. In some embodiments, the display mode is selected by a user, and in other embodiments, the display mode may be automatically selected by the AR device according to the selected engineering process, the lightweight digital representation, the location of the relevant process equipment, or the like. In some embodiments, the display modes may include an overlay mode where overlay data is aligned on a corresponding process element, and a comparison mode where overlay data is spaced apart from the corresponding process element, and may include one or more other display modes.

In block 1821, the AR display may determine whether the display mode needs to be changed. In some embodiments, the AR display may override a user display mode selection, or switch between selected display modes. The display mode change may be made according to the selected engineering process, for example, where a relevant part may not be visible in the selected process element, the display mode may be changed to a compare mode to illustrate a cutaway view or otherwise show a hidden part. In another embodiment, the display mode maybe changed to the compare mode according to a size of a relevant or highlighted portion of the process element, according to a resolution of a location that the AR may determine. For example, when a part size, or spacing between parts, is lower than the resolution at which the AR display is able to determine the location of the part, the AR display may switch to the compare mode so that an incorrect part is not highlighted or indicated.

In block 1823, the AR display determines the location for display of the overlay data. In some embodiments, the AR display may position the display of a portion of overlay data according to one or more of the location of the AR display, the location of the process element, the selected display mode, the lightweight digital representation, and the like. For example, when the compare mode is selected, the AR display may determine the location of the process element according to the lightweight digital representation and the meta-sensor data, and determine the bounds of the process element. The AR display may then determine a display location or display offset for the overlay data so that the overlay data does not occlude or overlap the process element. Thus, the process element and the projected digital representation of the process element are spaced apart so that a user may easily compare the two. In another example where the display mode is the overlay mode, the AR display may position the display of a portion of overlay data according to one or more of the location of the AR display, the location of the process element, the selected display mode, the lightweight digital representation, and the like to have a portion of the overlay data avoid overlaying the process element while another portion of the overlay data overlays or aligns with the process element. For example, when the overlay mode is selected, the AR display may determine the location of the process element according to the lightweight digital representation and the meta-sensor data, and determine the bounds of the process element. The AR display may then determine the size and location of the corresponding digital representation of the process element so that the digital representation of the process element aligns with and accurately overlays the live process element. The AR display may also provide a display location for overlay instructional data of the overlay data so that the overlay instructional data does not occlude or overlap the process element. Thus, the process element and the projected digital representation of the process element are aligned, while the overlay instructional data provides step by step instructions for executing the selected engineering process without interfering the user's view of the process element.

In block 1825, the AR display displays the equipment overly to a user in a display interface according to the determined location of the equipment overlay display.

An embodiment method for aligning displayed data in an augmented reality (AR) display, includes determining a selected location context associated with a piece of equipment, determining a process element associated with the piece of equipment and according to a selected engineering process, determining, according to a digital representation of the piece of equipment, a first location of the process element in the piece of equipment, receiving meta-sensor location data for one or more meta-sensors disposed on the piece of equipment, the meta-sensor location data indicating a second location for each of the one or more meta-sensors with respect to the selected location context, determining a third location of the AR display with respect to the selected location context, determining overlay data associated with the process element, determining a display location according to the first location of the process element and further according the third location and the location data of each meta-sensor of the one or more meta-sensors, and displaying, by the AR display, to a user, the overlay data at the display location.

In some embodiments, the selected location context is a real time location system (RTLS), and the determining the third location of the AR display comprises performing ranging with one or more beacons of the RTLS and determining the third location according to the ranging. In some embodiments, the method further includes determining a location relationship between the first location of the process element and the third location of the AR display according of the second location of each meta-sensor of the one or more meta-sensors, and the determining the display location comprises determining the display location according to the location relationship. In some embodiments, the method further includes receiving, by the AR display, the digital representation of the piece of equipment from a system of the piece of equipment, and the meta-sensor location data for each meta sensor of the one or more meta-sensors is location data generated by the respective meta-sensor according to ranging between the respective meta-sensor and the one or more beacons of the RTLS. In some embodiments, the method further includes determining a display mode that is one of an overlay mode or a compare mode, and the determining the display location includes determining a display location according to the first location of the process element, further according the third location and the meta-sensor location data, and further according to the display mode. In some embodiments, the method further includes determining a display offset according to the display mode and the digital representation, the display offset being a distance separating overlay data and the process element during the display of the of the overlay data, and the determining the display location comprises determining a display location according to the first location of the process element, further according the third location and the meta-sensor location data, and further according to the display offset. In some embodiments, the AR display is an AR headset, and the displaying the overlay data includes displaying the overlay data at the display location and in relation to a live view of the process element. In some embodiments, the displaying the overlay data includes displaying instructional data at a fourth location determined according to the first location of the process element, further according to the display location, and further according to a live view of the process element.

An embodiment augmented reality (AR) display device, includes a display, a processor, and a non-transitory computer-readable storage medium storing a program to be executed by the processor to align displayed data in an augmented reality (AR) display. The program includes instructions for determining a selected location context associated with a piece of equipment, determining a process element associated with the piece of equipment and according to a selected engineering process, determining, according to a digital representation of the piece of equipment, a first location of the process element in the piece of equipment, receiving meta-sensor location data for one or more meta-sensors disposed on the piece of equipment, the meta-sensor location data indicating a second location for each of the one or more meta-sensors with respect to the selected location context, determining a third location of the AR display device with respect to the selected location context, determining overlay data associated with the process element, determining a display location according to the first location of the process element and further according the third location and the meta-sensor location data, and causing the display to show the overlay data at the display location.

In some embodiments, the selected location context is a real time location system (RTLS), and the instructions for determining the third location of the AR display device include instructions for performing ranging with one or more beacons of the RTLS and determining the third location according to the ranging, the program further includes instruction for determining a location relationship between the first location of the process element and the third location of the AR display device according of the second location of each meta-sensor of the one or more meta-sensors, and the instructions for determining the display location include instructions for determining the display location according to the location relationship. In some embodiments, the program further includes instructions for receiving the digital representation of the piece of equipment from a system of the piece of equipment, and the meta-sensor location data for each meta sensor of the one or more meta-sensors is location data generated by the respective meta-sensor according to ranging between the respective meta-sensor and the one or more beacons of the RTLS. In some embodiments, the program further includes instructions for determining a display mode that is one of an overlay mode or a compare mode, and wherein the instructions for determining the display location include instructions for determining a display location according to the first location of the process element, further according the third location and the meta-sensor location data, and further according to the display mode. In some embodiments, the program further includes instructions for determining a display offset according to the display mode and the digital representation, the display offset being a distance separating overlay data and the process element during the display of the of the overlay data, and the instructions for determining the display location include instructions for determining a display location according to the first location of the process element, further according the third location and the meta-sensor location data, and further according to the display offset. In some embodiments, the AR display is an AR headset, and the instructions for causing the display to show the overlay data include instructions for displaying the overlay data at the display location and in relation to a live view of the process element. In some embodiments, the causing the display to show the overlay data comprises causing the display to show instructional data at a fourth location determined according to the first location of the process element, further according to the display location, and further according to a live view of the process element.

An embodiment system includes a real time location system (RTLS) associated with a vehicle and providing a location context, one or more meta-sensors disposed in the vehicle, each meta-sensor of the one or more meta-sensors configured to determine a respective first location representing a location of the respective meta sensor in the location context, and an augmented reality (AR) display configured to display digital overlay data in relation to at least a portion of the vehicle, further according to a second location of the AR display in relation to the location context and further according to the first location of each of the one or more meta-sensors.

In some embodiments, each meta-sensor of the one or more meta-sensors is further configured to generate respective location data indicating the respective first location of the respective meta-sensor, and to send the respective location data directly to the AR display. In some embodiments, the AR display is further configured to determine a display mode that is one of an overlay mode or a compare mode, and the AR display is further configured to display the digital overlay data in relation to the at least the portion of the vehicle, further according to a second location of the AR display in relation to the location context, further according to the first location of each of the one or more meta-sensors, and further according to the display mode. In some embodiments, the AR display is further configured to acquire a digital representation of the vehicle from a first system of the vehicle, the AR display is further configured to determine a third location of the at least the portion of the vehicle in relation to the second location of the AR display and further according to the first location of each of the one or more meta-sensors and the digital representation, and the AR display is further configured to display the digital overlay data according to the third location. In some embodiments, the AR display is further configured to select the portion of the vehicle according to a selected engineering process. In some embodiments, the AR display is further configured to acquire at least a portion of individualized equipment data from a second system of the vehicle, and to determine the selected engineering process from the portion of the individualized equipment data.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for aligning displayed data in an augmented reality (AR) display, the method comprising:
    determining a selected location context associated with a piece of equipment;
    determining a process element associated with the piece of equipment and according to a selected engineering process;
    determining, according to a digital representation of the piece of equipment, a first location of the process element in the piece of equipment;
    receiving meta-sensor location data for one or more meta-sensors disposed on the piece of equipment, the meta-sensor location data indicating a second location for each of the one or more meta-sensors with respect to the selected location context;
    determining a third location of the AR display with respect to the selected location context;
    determining overlay data associated with the process element;
    determining a display location according to the first location of the process element and further according the third location and the location data of each meta-sensor of the one or more meta-sensors; and
    displaying, by the AR display, to a user, the overlay data at the display location.

2. The method according to claim 1, wherein the selected location context is a real time location system (RTLS), and wherein the determining the third location of the AR display comprises performing ranging with one or more beacons of the RTLS and determining the third location according to the ranging;
    wherein the method further comprises determining a location relationship between the first location of the process element and the third location of the AR display according of the second location of each meta-sensor of the one or more meta-sensors; and
    wherein the determining the display location comprises determining the display location according to the location relationship.

3. The method according to claim 2, further comprising receiving, by the AR display, the digital representation of the piece of equipment from a system of the piece of equipment; and
    wherein the meta-sensor location data for each meta sensor of the one or more meta-sensors is location data generated by the respective meta-sensor according to ranging between the respective meta-sensor and the one or more beacons of the RTLS.

4. The method according to claim 1, further comprising determining a display mode that is one of an overlay mode or a compare mode; and
    wherein the determining the display location comprises determining a display location according to the first location of the process element, further according the third location and the meta-sensor location data, and further according to the display mode.

5. The method according to claim 4, further comprising determining a display offset according to the display mode and the digital representation, the display offset being a distance separating overlay data and the process element during the display of the of the overlay data; and wherein the determining the display location comprises determining a display location according to the first location of the process element, further according the third location and the meta-sensor location data, and further according to the display offset.

6. The method according to claim 4, wherein the AR display is an AR headset; and
wherein the displaying the overlay data comprises displaying the overlay data at the display location and in relation to a live view of the process element.

7. The method according to claim 1, wherein the displaying the overlay data comprises displaying instructional data at a fourth location determined according to the first location of the process element, further according to the display location, and further according to a live view of the process element.

8. An augmented reality (AR) display device, comprising:
a display;
a processor; and
a non-transitory computer-readable storage medium storing a program to be executed by the processor to align displayed data in an augmented reality (AR) display, the program including instructions for:
determining a selected location context associated with a piece of equipment;
determining a process element associated with the piece of equipment and according to a selected engineering process;
determining, according to a digital representation of the piece of equipment, a first location of the process element in the piece of equipment;
receiving meta-sensor location data for one or more meta-sensors disposed on the piece of equipment, the meta-sensor location data indicating a second location for each of the one or more meta-sensors with respect to the selected location context;
determining a third location of the AR display device with respect to the selected location context;
determining overlay data associated with the process element;
determining a display location according to the first location of the process element and further according the third location and the meta-sensor location data; and
causing the display to show the overlay data at the display location.

9. The AR display device according to claim 8, wherein the selected location context is a real time location system (RTLS), and wherein the instructions for determining the third location of the AR display device include instructions for performing ranging with one or more beacons of the RTLS and determining the third location according to the ranging;
wherein the program further includes instruction for determining a location relationship between the first location of the process element and the third location of the AR display device according of the second location of each meta-sensor of the one or more meta-sensors; and
wherein the instructions for determining the display location include instructions for determining the display location according to the location relationship.

10. The AR display device according to claim 9, wherein the program further includes instructions for receiving the digital representation of the piece of equipment from a system of the piece of equipment; and
wherein the meta-sensor location data for each meta sensor of the one or more meta-sensors is location data generated by the respective meta-sensor according to ranging between the respective meta-sensor and the one or more beacons of the RTLS.

11. AR display device according to claim 8, wherein the program further includes instructions for determining a display mode that is one of an overlay mode or a compare mode; and
wherein the instructions for determining the display location include instructions for determining a display location according to the first location of the process element, further according the third location and the meta-sensor location data, and further according to the display mode.

12. The AR display device according to claim 11, wherein the program further includes instructions for determining a display offset according to the display mode and the digital representation, the display offset being a distance separating overlay data and the process element during the display of the of the overlay data; and
wherein the instructions for determining the display location include instructions for determining a display location according to the first location of the process element, further according the third location and the meta-sensor location data, and further according to the display offset.

13. The AR display device according to claim 11, wherein the AR display is an AR headset; and
wherein the instructions for causing the display to show the overlay data include instructions for displaying the overlay data at the display location and in relation to a live view of the process element.

14. The AR display device according to claim 8, wherein the causing the display to show the overlay data comprises causing the display to show instructional data at a fourth location determined according to the first location of the process element, further according to the display location, and further according to a live view of the process element.

15. A system, comprising:
a real time location system (RTLS) associated with a vehicle and providing a location context;
one or more meta-sensors disposed in the vehicle, each meta-sensor of the one or more meta-sensors configured to determine a respective first location representing a location of the respective meta sensor in the location context; and
an augmented reality (AR) display configured to display digital overlay data in relation to at least a portion of the vehicle, further according to a second location of the AR display in relation to the location context and further according to the first location of each of the one or more meta-sensors.

16. The system according to claim 15, wherein each meta-sensor of the one or more meta-sensors is further configured to generate respective location data indicating the respective first location of the respective meta-sensor, and to send the respective location data directly to the AR display.

17. The system according to claim 15, wherein the AR display is further configured to determine a display mode that is one of an overlay mode or a compare mode; and
wherein the AR display is further configured to display the digital overlay data in relation to the at least the portion of the vehicle, further according to a second location of the AR display in relation to the location context, further according to the first location of each of the one or more meta-sensors, and further according to the display mode.

18. The system according to claim 15, wherein the AR display is further configured to acquire a digital representation of the vehicle from a first system of the vehicle;
  wherein the AR display is further configured to determine a third location of the at least the portion of the vehicle in relation to the second location of the AR display and further according to the first location of each of the one or more meta-sensors and the digital representation; and
  wherein the AR display is further configured to display the digital overlay data according to the third location.

19. The system according to claim 15, wherein the AR display is further configured to select the portion of the vehicle according to a selected engineering process.

20. The system according to claim 19, wherein the AR display is further configured to acquire at least a portion of individualized equipment data from a second system of the vehicle, and to determine the selected engineering process from the portion of the individualized equipment data.

* * * * *

UNITED STATES PATENT AND TRADEMARK OFFICE
CERTIFICATE OF CORRECTION

PATENT NO. : 10,783,671 B1  
APPLICATION NO. : 16/351270  
DATED : September 22, 2020  
INVENTOR(S) : Jeremy Robert Chavez Page 1 of 1

It is certified that error appears in the above-identified patent and that said Letters Patent is hereby corrected as shown below:

In the Claims

Column 30, Line 6, Claim 11, delete "AR display" and insert --The AR display--.

Signed and Sealed this  
Tenth Day of November, 2020

Andrei Iancu  
*Director of the United States Patent and Trademark Office*